(12) United States Patent
Abe et al.

(10) Patent No.: US 7,981,704 B2
(45) Date of Patent: Jul. 19, 2011

(54) METHOD FOR MANUFACTURING SEMICONDUCTOR OPTICAL DEVICE

(75) Inventors: Shinji Abe, Tokyo (JP); Kazushige Kawasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 322 days.

(21) Appl. No.: 11/868,629

(22) Filed: Oct. 8, 2007

(65) Prior Publication Data

US 2008/0090315 A1   Apr. 17, 2008

(30) Foreign Application Priority Data

Oct. 16, 2006  (JP) .................. 2006-281433
Sep. 7, 2007   (JP) .................. 2007-232318

(51) Int. Cl.
*H01L 21/00* (2006.01)
(52) U.S. Cl. ............... 438/22; 438/16; 438/31; 257/98; 257/E21.002; 257/E33.067
(58) Field of Classification Search ............ 438/22
See application file for complete search history.

(56) References Cited

U.S. PATENT DOCUMENTS

| 5,898,222 | A  | * | 4/1999 | Farooq et al. ............... 257/762 |
| 6,171,876 | B1 | * | 1/2001 | Yuang et al. ................ 438/22 |
| 6,174,747 | B1 | * | 1/2001 | Ho et al. ..................... 438/31 |
| 2002/0008966 | A1 | * | 1/2002 | Fjelstad et al. ............ 361/760 |
| 2005/0226295 | A1 |   | 10/2005 | Taneya et al. |

FOREIGN PATENT DOCUMENTS

| JP | 04-48670     |   | 2/1992  |
| JP | 7-307526     |   | 11/1995 |
| JP | 10-27935     |   | 1/1998  |
| JP | 10-117038    |   | 5/1998  |
| JP | 11-126947    |   | 5/1999  |
| JP | 2000-22261   |   | 1/2000  |
| JP | 2000-114664  |   | 4/2000  |
| JP | 2000-340880  |   | 12/2000 |
| JP | 2004-119772 A| * | 12/2000 |
| JP | 2001-308461  |   | 11/2001 |
| JP | 2003-115632  | * | 4/2003  |
| JP | 2003-142769  |   | 5/2003  |
| JP | 2000-349395  | * | 4/2004  |
| JP | 2004-253545  |   | 9/2004  |
| WO | 03/085790    |   | 10/2003 |

* cited by examiner

*Primary Examiner* — Kimberly D Nguyen
*Assistant Examiner* — Mohammad Choudhry
(74) *Attorney, Agent, or Firm* — Leydig, Voit & Mayer, Ltd.

(57) ABSTRACT

After a metal cap layer is laminated on a semiconductor laminated structure, a waveguide ridge is formed, the waveguide ridge is coated with an $SiO_2$ film, and a resist is applied; then, a resist pattern is formed, the resist pattern exposing the surface of the $SiO_2$ film on the top of the waveguide ridge, and burying the $SiO_2$ film in channels with a resist film having a surface higher than the surface of the metal cap layer of the waveguide ridge and lower than the surface of the $SiO_2$ film of the waveguide ridge; the $SiO_2$ film is removed by dry etching, using the resist pattern as a mask. The metal cap layer is removed by wet etching, and a p-GaN layer of the waveguide ridge is exposed to form the electrode layer.

10 Claims, 10 Drawing Sheets

METHOD FOR MANUFACTURING SEMICONDUCTOR OPTICAL DEVICE

BACKGROUND OF THE INVENTION

1. Field of the Invention

The present invention relates to a method for manufacturing a semiconductor optical device, and more specifically to a method for manufacturing a semiconductor optical device having an electrode on the top of a waveguide ridge.

2. Description of the Related Art

In recent years, as a semiconductor laser that can emit light from a blue region to a violet region required in high-density optical disks, a nitride semiconductor laser using a III-V nitride compound semiconductor, such as AlGaInN, has been actively studied and developed, and has been already put in practical use.

Such a blue-violet laser diode (hereafter, a laser diode will be abbreviated as an LD) is formed by growing the crystals of a compound semiconductor on a GaN substrate.

Typical compound semiconductors include III-V compound semiconductors wherein a group III element is combined with a group V element, and by combining a plurality of group III atoms and group V atoms, mixed-crystal compound semiconductors having various composition ratios can be obtained. The examples of compound semiconductors used in blue-violet LDs include GaN, GaPN, GaNAs, InGaN, and AlGaN.

An LD of a waveguide ridge type is normally provided with an electrode layer on the top of the waveguide ridge. The electrode layer is connected to a contact layer, which is the uppermost layer of the waveguide ridge, through an opening formed on the top if the waveguide ridge in an insulating film that coats the waveguide ridge. The insulating film having the opening is formed by a liftoff method using a resist mask used when the waveguide ridge is formed. Since the resist mask adhered to the contact layer for this purpose is depressed along the surface of the contact layer in the joining portion with the contact layer, a part of the insulating film that coats the waveguide ridge along this dent is left even after liftoff, and only the remaining insulating film coats the surface of the contact layer, resulting in that the contact area between the electrode layer and the contact layer is smaller than the entire surface area of the contact layer.

Since the materials for contact layers used in conventional red LDs, such as GaAs, have relatively low contact resistances, decrease in the contact area caused by the liftoff method did not significantly increase the contact resistance, and did not significantly effect the elevation of the operating voltage of the LD.

However, in the case of a blue-violet LD, since the material used in the contact layer is GaN or the like, and the contact resistance of the material is relatively high, decrease in the contact area between the electrode and the contact layer elevated the contact resistance between the electrode and the contact layer, resulting in the elevation of the operating voltage of the blue-violet LD.

Known examples of LD manufacturing methods to prevent decrease in the contact area between an electrode and a contact layer are as follows:

In the case of forming a nitride semiconductor laser element, a p-type electrode layer 112 composed of palladium/molybdenum/gold is first formed on a p-type contact layer 111 of a wafer containing a plurality of semiconductor layers. Next, a stripe-shaped resist mask (not shown) is formed on the p-type electrode layer 112, and ridge stripes 114 are formed using RIE (reactive ion etching). Specifically, the p-type electrode layer 112 is formed by etching using Ar gas, and ridge stripes 114 are formed by etching the p-type contact layer 111 and to the middle of the p-type clad layer 110, or by etching to the middle of the p-type guide layer 109 using a mixed gas of Ar, $Cl_2$ and $SiCl_4$. Furthermore, an insulating film 115 (Zr oxides consisting mainly of $ZrO_2$) having a thickness of 0.5 μm is formed so as to coat the upper surface of the wafer leaving the resist of the ridge stripes 114. Thereafter, the resist is removed to expose the upper sides of the ridge stripes 114. Furthermore, a p-type pad electrode 116 composed of molybdenum and gold is formed so as to coat the p-type electrode layer 112 and at least the insulating films 115 in the vicinity of the both sides thereof. (For example, refer to National Publication of International Patent Application No. JP WO 2003/085790 A1, p. 9, 1. 42-50, and FIG. 1.)

In another known example discloses a self-aligning method for manufacturing a ridge waveguide semiconductor LD including a step for laminating two different photo-resist layers. The manufacturing method is as follows:

The lower photo-resist layer reacts only with the light having a wavelength of shorter than 300 nm; and the upper photo-resist layer reacts only with the light having a wavelength of longer than 300 nm. In a semiconductor laminated structure wherein a second coated waveguide 406 is formed and a cap layer 408 is formed thereon, the cap layer 408 and a part of the second coated waveguide layer 406 are removed to form a ridge structure 414 and a double channel 412. Furthermore, a second insulating film 416 is formed on the surface of the ridge structure 414 and the double channel 412. On the second insulating film 416, a lower-layer first photo-resist layer 420 and an upper-layer second photo-resist layer 422 are formed. The second photo-resist layer 422 is patterned to expose the first photo-resist layer 420 in the vicinity of the ridge structure 414. Next, to expose the second insulating film 416 on the ridge structure 414, an RIE process is carried out to the first photo-resist layer 420. Then, to remove the second insulating film 416 outside the ridge structure 414, an etching process including an RIE process is executed. Next, the remaining first photo-resist layer 420 and second photo-resist layer 422 are removed, and a first metal layer 424 is vapor-deposited as an electrode. (For example, refer to Japanese Patent Application Laid-Open No. 2000-22261, paragraph Nos. [0024] to [0034], and FIGS. 7 to 18.)

Further in another known example, the following method is disclosed: A ridge and a channel are formed by etching the contact layer by wet etching using an Al metal mask, and further performing wet etching using the contact layer as a mask while leaving the Al metal mask; and an insulating film is formed on the entire surface by plasma CVD, then, the Al pattern and the insulating film deposited thereon is removed by a lift off method. Next, using a normal lithography process, a resist pattern, wherein the p-side electrode portion is exposed, is formed, and an electrode material is vacuum-deposited using the resist pattern as the mask, and the resist pattern and the electrode material are removed by a liftoff method to form an electrode closely contacting the contact layer of the ridge. (For example, refer to Japanese Patent Application Laid-Open No. 2000-340880, paragraph Nos. [0025] to [0034], and FIG. 1.)

Further in another known example, the following method is disclosed: A first protecting film 61 is formed on the substantially entire surface of a contact layer 13, and a stripe-shaped third protecting film 63 is formed on the first protecting film 61. After etching the first protecting film 61 leaving the third protecting film 63, the third protecting film 63 is removed, and a stripe-shaped first protecting film 61 is formed. Then, by etching the p-side contact layer 13 and to the middle of the layer under the contact layer, for example, the p-side clad layer 12, to form a stripe-shaped waveguide. Next, an insulating second protecting film 62 is formed of a material different from the first protecting film 61 on the side of the stripe-shaped waveguide and the nitride semiconductor layer exposed by etching, the plane of the p-type clad layer 12 in the previous etching; only the first protecting film 61 is removed by a liftoff method; and a p-electrode electrically connected to a p-side contact layer 13 is formed on the second protecting film and the p-side contact layer 13. (For example, refer to Japanese Patent Application Laid-Open No. 2003-142769, paragraph Nos. [0020] to [0027], and FIG. 1.)

By these conventional methods, even if the contact area between the contact layer and the electrode layer of the waveguide ridge is secured, there were problems in stably manufacturing a device having all favorable characteristics, such as the step for simultaneously etching the metal film and the semiconductor layer under the metal film; the step for discontinue etching stably leaving a predetermined thickness of the underlying resist when two layers of resist were used; and the step performing liftoff when a metal film was used as the mask or a plurality of protective films were used. There were also problems of the lowering of process freedom or the like when a plurality of resists or protective films were used.

Therefore, in order to stably prevent the shrinkage of the contact area between the semiconductor layer and the electrode layer on the upper surface of the waveguide ridge, the following manufacturing process has been developed.

First, a waveguide ridge is formed by forming channels in a wafer formed by laminating semiconductor layers, and an $SiO_2$ film is formed on the entire surface of the wafer. Then, a resist is applied onto the entire surface of the wafer to form a resist film so that the resist films in the channels are thicker than the resist film on the top of the waveguide ridge. Next, the resist is evenly removed from the surface of the resist film by dry etching, and the resist film on the top of the waveguide ridge is removed leaving the resist films in the channels to form a resist pattern to expose the top of the waveguide ridge. Then, the exposed $SiO_2$ film is evenly etched from the surface using the resist pattern as the mask, and the $SiO_2$ film formed on the top of the waveguide ridge is removed leaving $SiO_2$ films formed on the sides and bottoms of the channels to surely form opening in the $SiO_2$ film on the top of the waveguide ridge.

Next, after removing the resist pattern, a p-side electrode is formed on the top of the waveguide ridge.

As a heretofore known example for forming ridge stripes using a p-type ohmic electrode as a mask, there has been disclosed an example wherein a stripe-shaped metal layer (first layer: Ni/Au, second layer: Pt) is formed on the upper surface of a p-type contact layer composed of GaN, then, heat treatment (alloying) is performed to form a p-type ohmic electrode, and etching is performed until the p-type guide layer is exposed using $Cl_2$ as an etching gas and using the p-type ohmic electrode as a mask. (For example, refer to Japanese Patent Application Laid-Open No. 2004-253545, paragraph Nos. [0035] to [0038], and FIG. 2.)

As another heretofore known example for forming a ridge, the following process has been disclosed. In the first step, a first protective film 61 composed of an oxide of Si on the substantially entire surface of the p-side contact layer 13, and a stripe-shaped third protective film 63 is formed on the first protective film 61. After etching the first protective film 61 leaving the third protective film 63, the third protective film 63 is removed to form the stripe-shaped first protective film 61. Then in the second step, etching is performed from the portion where the first protective film 61 has not been formed in the p-side contact layer 13 on which the first protective film 61 is formed to form a stripe shaped waveguide region corresponding to the protective film in the portion immediately below the first protective film 61. Next in the third step, using an insulating material that is a material different from the first protective film 61, a second protective film is formed on the sides of the stripe-shaped waveguide, the surface of the nitride semiconductor layer (p-side clad layer 12) exposed by etching, and the first protective film 61. After forming the second protective film 62, by removing the first protective film 61 by etching, only the second protective film formed on the first protective film 61 is removed, and the second protective film is continuously formed on the sides of the stripes and the surface of the p-side clad layer 12.

Although the etching treatment in the third step is not specifically limited, for example a method to perform dry etching using hydrofluoric acid is included. (For example, refer to Japanese Patent Application Laid-Open No. 2000-114664, paragraph Nos. [0018] to [0024], and FIG. 6.)

In the steps of conventional methods, that is, forming a waveguide ridge by forming channels in a wafer, coating the wafer with the $SiO_2$ film, applying a resist onto the $SiO_2$ film, forming a resist pattern wherein the top of the waveguide ridge is exposed leaving the resist film in the channels, and evenly etching the exposed $SiO_2$ film from the surface, removing the $SiO_2$ film formed on the top of the waveguide ridge leaving the $SiO_2$ film formed on the sides and the bottoms of the channels to form an opening in the $SiO_2$ film on the top of the waveguide ridge; when dry etching is performed to etch off the $SiO_2$ film in the step for forming the opening in the $SiO_2$ film on the top of the waveguide ridge, damages in the semiconductor layer coated by the $SiO_2$ film might be caused by etching. For example, when the underlying layer of the $SiO_2$ film was a p-type contact layer, it might be damaged by etching, and contact resistance might be elevated. Especially when the p-type contact layer was composed of a material containing GaN, there was a problem in that it was difficult to remove the material containing GaN by wet etching, and it was difficult to remove the damaged portion by wet etching.

SUMMARY OF THE INVENTION

The present invention has been made to solve the problem, and the first object of the present invention is to provide a method for manufacturing a semiconductor optical device at a high yield by simple steps that can stably prevent decrease in the contact area between a semiconductor layer and an electrode layer on the upper surface of a waveguide ridge, and damages in the semiconductor layer on the top of the waveguide ridge by etching.

According to one aspect of the present invention, there is provided a method for manufacturing a semiconductor optical device, comprising: sequentially laminating a first semiconductor layer of a first conductivity type, an active layer, a second semiconductor layer of a second conductivity type, and a cap layer on a semiconductor substrate, to form a semiconductor laminated structure; applying a resist onto the surface of the semiconductor laminated structure, and forming a first resist pattern with a stripe-shaped resist film portion having a width corresponding to a waveguide ridge using photolithography; etching off the cap layer using the first resist pattern as a mask to expose the second semiconductor layer; removing a part of the upper surface side of the second semiconductor layer by dry etching using the first resist pattern as a mask to form a dent leaving a part of the second semiconductor layer on the bottom, and to form the waveguide ridge; forming an insulating film on the surface of the semiconductor laminated structure containing the dent and the waveguide ridge having the cap layer on the uppermost surface after removing the first resist pattern; forming a second resist pattern, the second resist pattern exposing the surface of the insulating film on the top of the waveguide ridge, and burying the insulating film in the dent adjoining the waveguide ridge by a resist film having a surface higher than the surface of the second semiconductor layer of the waveguide ridge and lower than the surface of the insulating film on the top of the waveguide ridge; removing the insulating film by dry etching using the second resist pattern as a mask to expose the surface of the cap layer of the waveguide ridge; removing the cap layer by wet etching to expose the second semiconductor layer; and forming an electrode layer on the surface of the exposed second semiconductor layer of the waveguide ridge.

Accordingly, in the method for manufacturing a semiconductor optical device according to the present invention, the second resist pattern formed in the dent adjoining the waveguide ridge has a surface higher than the surface of the cap layer of the waveguide ridge, but lower than the surface of the insulating film on the top of the waveguide ridge. When the insulating film on the top of the waveguide ridge is removed by dry etching using the second resist pattern, the cap layer on the top of the waveguide ridge is exposed leaving the insulating film on the side of the waveguide ridge and in the dent. Furthermore, when the cap layer is removed by wet etching, the second semiconductor layer is exposed, and an electrode layer is formed on the exposed second semiconductor layer. Therefore, the second semiconductor layer can be joined to the electrode layer without the shrinkage of the contact area. And since the cap layer has been formed on the second semiconductor layer of the waveguide ridge when the insulating film by dry etching using the second resist pattern as the mask is removed, the damage of the second semiconductor layer due to dry etching can be prevented, and the elevation of the contact resistance of the second semiconductor layer caused by dry etching can be suppressed.

According to another aspect of the present invention, there is provided a method for manufacturing a semiconductor optical device, comprising: sequentially laminating a first semiconductor layer of a first conductivity type, an active layer, and a second semiconductor layer of a second conductivity type on a semiconductor substrate, to form a semiconductor laminated structure; applying a resist onto the surface of the semiconductor laminated structure, and forming a first resist pattern with a stripe-shaped resist film portion having a width corresponding to a waveguide ridge using photolithography; removing a part of the upper surface side of the second semiconductor layer by dry etching using the first resist pattern as a mask to form a dent leaving a part of the second semiconductor layer on the bottom, and to form the waveguide ridge, forming an insulating film on the surface of the semiconductor laminated structure including the dent and the waveguide ridge leaving the first resist pattern; removing the insulating film on the sides of the waveguide ridge leaving the insulating film in the dent and on the top of the waveguide ridge to expose the sidewalls of the waveguide ridge; removing the resist pattern and the insulating film left on the resist pattern using a liftoff method to expose the second semiconductor layer; and forming an electrode layer on the surface of the exposed second semiconductor layer of the waveguide ridge.

Accordingly, in the method for manufacturing a semiconductor optical device according to the present invention, the electrode layer can be joined to the second semiconductor layer without the shrinkage of the contact area. Furthermore, since no dry etching is used when the second semiconductor layer on the top of the waveguide ridge is exposed, no damages due to dry etching occur in the second semiconductor layer, and the elevation of the contact resistance can be suppressed.

According to further aspect of the present invention, there is provided a method for manufacturing a semiconductor optical device, comprising: forming, by photolithography, a first resist pattern of a resist film disposed on a top surface of a laminated semiconductor structure including a first semiconductor layer of a first conductivity type, an active layer, a second semiconductor layer of a second conductivity type, and a cap layer, in sequence, on a substrate, the first resist pattern having a portion shaped in correspondence to a waveguide ridge; etching off the cap layer using the first resist pattern as a mask to expose the second semiconductor layer; removing a part of the upper surface side of the second semiconductor layer by dry etching using the first resist pattern as a mask to form a dent leaving a part of the second semiconductor layer on the bottom, and to form the waveguide ridge; forming an insulating film on the surface of the semiconductor laminated structure containing the dent and the waveguide ridge having the cap layer on the uppermost surface after removing the first resist pattern; forming a second resist pattern, the second resist pattern exposing the surface of the insulating film formed on the top of the waveguide ridge, and burying the insulating film in the dent adjoining the waveguide ridge by a resist film having a surface higher than the surface of the second semiconductor layer of the waveguide ridge and lower than the surface of the insulating film on the top of the waveguide ridge; removing the insulating film by dry etching using the second resist pattern as a mask to expose the surface of the cap layer of the waveguide ridge; removing the cap layer by wet etching to expose the second semiconductor layer; and forming an electrode layer on the surface of the exposed second semiconductor layer of the waveguide ridge Accordingly, in the method for manufacturing a semiconductor optical device according to the present invention, the second resist pattern formed in the dent adjoining the waveguide ridge has a surface higher than the surface of the cap layer of the waveguide ridge, but lower than the surface of the insulating film on the top of the waveguide ridge. When the insulating film on the top of the waveguide ridge is removed by dry etching using the second resist pattern, the cap layer on the top of the waveguide ridge is exposed leaving the insulating film on the side of the waveguide ridge and in the dent. Furthermore, when the cap layer is removed by wet etching, the second semiconductor layer is exposed, and an electrode layer is formed on the exposed second semiconductor layer. Therefore, the second semiconductor layer can be joined to the electrode layer without the shrinkage of the contact area. And since the cap layer has been formed on the second semiconductor layer of the waveguide ridge when the insulating film by dry etching using the second resist pattern as the mask is removed, the damage of the second semiconductor layer due to dry etching can be prevented, and the elevation of the contact resistance of the second semiconductor layer caused by dry etching can be suppressed.

According to yet another aspect of the present invention, there is provided a method for manufacturing a semiconductor optical device comprising: forming, by photolithography, a resist pattern of a resist film disposed on a top surface of a laminated semiconductor structure including a first semiconductor layer of a first conductivity type, an active layer, and a second semiconductor layer of a second conductivity type, in sequence, on a substrate, the first resist pattern having a portion shaped in correspondence to a waveguide ridge; removing a part of the upper surface side of the second semiconductor layer by dry etching using the resist pattern as a mask to form a dent leaving a part of the second semiconductor layer on the bottom, and to form the waveguide ridge; forming an insulating film on the surface of the semiconductor laminated structure containing the dent and the waveguide ridge leaving the resist pattern; removing the insulating film on the side of the waveguide ridge leaving the insulating film in the dent and on the top of the waveguide ridge to expose the sidewall of the waveguide ridge; removing the resist pattern and the insulating film left on the resist pattern using a liftoff method to expose the second semiconductor layer; and forming an electrode layer on the surface of the second semiconductor layer of the waveguide ridge.

Accordingly, in the method for manufacturing a semiconductor optical device according to the present invention, the electrode layer can be joined to the second semiconductor layer without the shrinkage of the contact area. Furthermore, since no dry etching is used when the second semiconductor layer on the top of the waveguide ridge is exposed, no damages due to dry etching occur in the second semiconductor layer, and the elevation of the contact resistance can be suppressed.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

In the following embodiments, also a blue-violet LD will be described as an example, the present invention can be applied not only to the blue-violet LD, but also to any semiconductor optical device, such as a red LD, and the same effects can be obtained.

Therefore, materials composing the semiconductor laminated structure include not only nitride semiconductors, but also InP-based materials and GaAs-based materials. Further, the substrate is not limited to a GaN substrate, but may be substrates composed of other semiconductors, such as InP, GaAs, Si, and SiC, or other insulating substrates, such as a sapphire substrate.

First Embodiment

Figure 1:
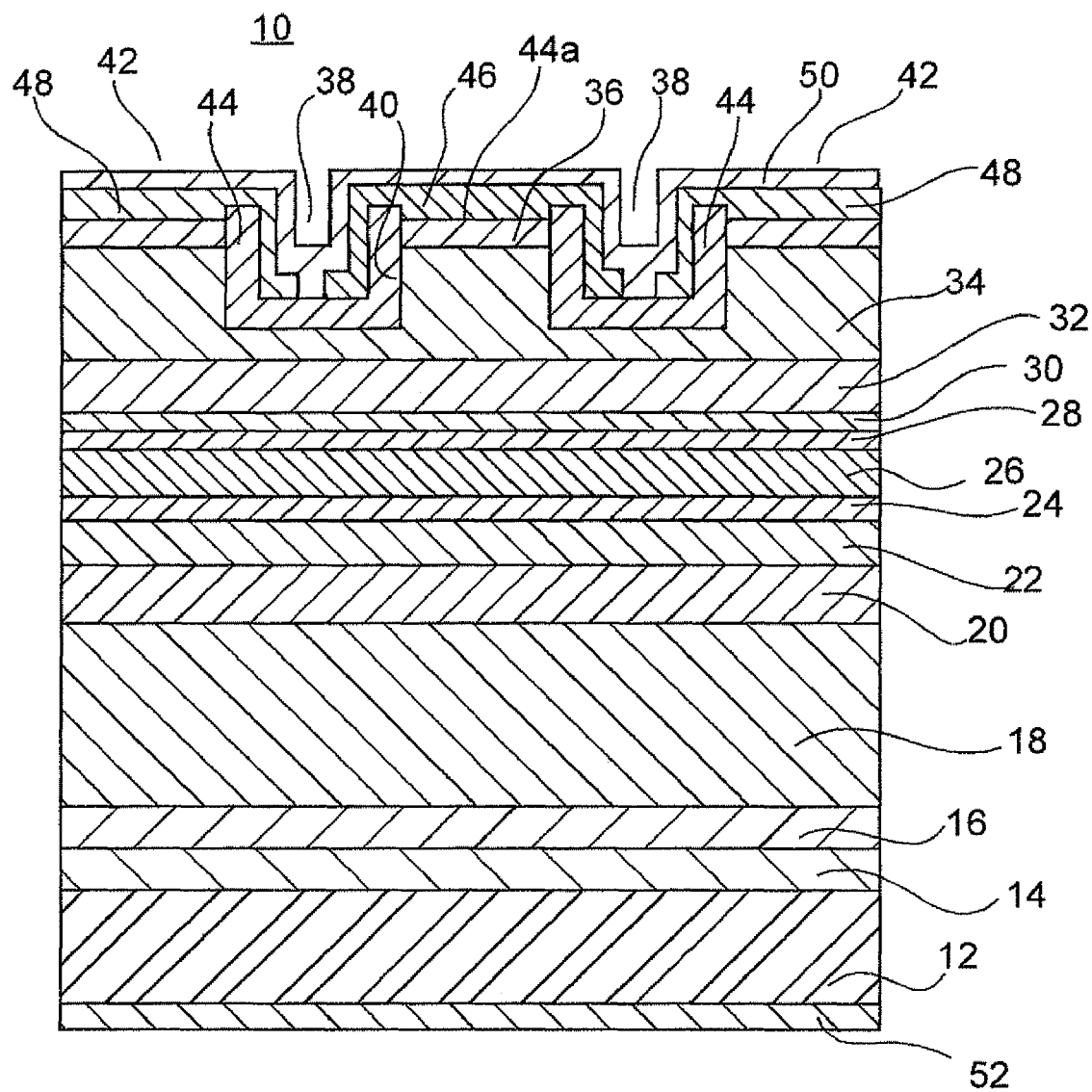
FIG. 1 is a sectional view showing a semiconductor LD according to an embodiment of the present invention.

FIG. 1 is a sectional view showing a semiconductor LD according to an embodiment of the present invention. In the drawings herein, the same numerals and characters denote the same or equivalent parts.

In FIG. 1, the LD 10 is a blue-violet LD of a waveguide ridge type, wherein a buffer layer 14 formed on the Ga surface, which is a major surface of n-type GaN substrate 12 (hereafter "n-type" is simply referred to as "n-", "p-type" is simply referred to as "p-", and in the case of "undoped" wherein no impurities are doped is simply referred to as "i-"), for example, a first n-clad layer 16, a second n-clad layer 18, and a third n-clad layer 20 as first semiconductor layers formed of n-AlGaN are formed on the buffer layer 14; and an n-side light guiding layer 22 formed of n-GaN, an n-side SCH (separate confinement hetero-structure) layer 24 formed of InGaN, and an active layer 26 are sequentially laminated on the third n-clad layer 20.

On the active layer 26 are sequentially laminated a p-side SCH layer 28 formed of InGaN, an electron barrier layer 30 formed of p-AlGaN, a p-side light guiding layer 32 formed of p-GaN, a p-clad layer 34 formed of p-AlGaN, and a contact layer 36 formed of p-GaN. In the first embodiment, the second semiconductor layer includes the p-clad layer 34 and the contact layer 36. However, depending on circumstances, the second semiconductor layer can be a single layer, or can include more than two layers.

By forming channels 38 as dents in the contact layer 36 and the p-clad layer 34, the contact layer 36 and a part of the p-clad layer 34 on the sides contacting the contact layer 36 form waveguide ridges 40.

The waveguide ridges 40 are disposed in the center portion in the width direction of cleaved end surfaces to be the resonator end surfaces of the LD 10, and extend between both end surfaces to be the resonator end surfaces. The length of the waveguide ridges 40 in the lengthwise direction, that is the resonator length, is 1000 µm; and the ridge width in the direction perpendicular to the lengthwise direction is 1 micrometer to several tens of micrometers, and for example, 1.5 µm in the first embodiment.

The channel width is 10 µm in the first embodiment. The table-shaped portions formed on the both outsides of the waveguide ridges 40 across the channels 38 are, for example, the electrode pad base 42.

The depth of the waveguide ridges 40, that is the height of the channels 38 from the bottom surface, is, for example, 0.5 µm.

The both sides and the bottom surfaces of the channels 38 including the sidewalls of the waveguide ridges 40 and the sidewalls of the electrode pad base 42 are coated with first silicon oxide film 44 serving as first insulating film. The upper ends of the first silicon oxide films 44 covering both sides of the channel 38 are slightly extruded from the upper surface of the contact layer 36. The first silicon oxide film 44 is formed of $SiO_2$ film having a thickness of 200 nm. The first silicon oxide film 44 is not formed on the upper surface of the contact layer 36, and an opening 44a of the first silicon oxide film 44 exposes the entire upper surface of the contact layer 36.

On the upper surface of the contact layer 36 is formed a p-side electrode 46 contacting the contact layer 36 and electrically connected thereto. The p-side electrode 46 is formed by sequentially laminating platinum (Pt) and Au using a vacuum vapor deposition method. The p-side electrode 46 closely contacts the upper surface of the contact layer 36, further coats the upper end of the first silicon oxide film 44 so as to nip it, and extends through the first silicon oxide film 44 on the sidewalls of the waveguide ridges 40 to a part of the first silicon oxide film 44 on the bottom of the channels 38.

On the upper surface of the electrode pad base 42, and on the surface of the first silicon oxide film 44 on the side of the electrode pad base 42 in the channels 38 and a part of the first silicon oxide film 44 on the bottom of the channels 38, a second silicon oxide film 48 formed of, for example, $SiO_2$ is disposed.

A pad electrode 50 is disposed on the surface of the p-side electrode 46 adhering thereto; the pad electrode 50 is disposed on the p-side electrode 46, the first silicon oxide film 44, and the second silicon oxide film 48 in the channels 38 in the both sides, and further extends onto the second silicon oxide film 48 disposed on the upper surface of the electrode pad base 42.

Further on the back face of the n-GaN substrate 12 is formed an n-side electrode 52 formed by sequentially laminating Ti and Au films by vacuum vapor deposition.

In the LD 10, silicon (Si) is doped as an n-type impurity, and magnesium (Mg) is doped as a p-type impurity.

The n-GaN substrate 12 has a thickness of about 100 μm. The buffer layer 14 has a thickness of about 1 μm. The first n-clad layer 16 has a thickness of about 400 nm and is formed of, for example, n-$Al_{0.07}Ga_{0.93}N$; the second n-clad layer 18 has a thickness of about 1000 nm and is formed of, for example, n-$Al_{0.045}Ga_{0.955}N$; and the third n-clad layer 20 has a thickness of about 300 nm and is formed of, for example, n-$Al_{0.015}Ga_{0.985}N$ layer.

The n-side guide layer 22 has a thickness of, for example, 80 nm. The n-side SCH layer 24 has a thickness of 30 nm, and is formed of i-$In_{0.02}Ga_{0.98}N$.

The active layer 26 has a double quantum well structure composed of a well layer 26a having a thickness of 5 nm composed of i-$In_{0.12}Ga_{0.88}N$ disposed in contact with the n-side SCH layer 24; a barrier layer 26b having a thickness of 8 nm composed of i-$In_{0.02}Ga_{0.98}N$ disposed on the well layer 26a; and a well layer 26c having a thickness of 5 nm composed of i-$In_{0.12}Ga_{0.88}N$ disposed on the barrier layer 26b.

The p-side SCH layer 28 disposed on and in contact with the well layer 26c of the active layer 26 has a thickness of 30 nm and is formed of i-$In_{0.02}Ga_{0.98}N$.

The electron barrier layer 30 has a thickness of about 20 nm and is formed of p-$Al_{0.2}Ga_{0.8}N$. The p-side light guiding layer 32 has a thickness of 100 nm; the p-clad layer 34 has a thickness of about 500 nm and is formed of p-$Al_{0.07}Ga_{0.93}N$; and the contact layer 36 has a thickness of 20 nm.

Next, a method for fabricating the LD 10 will be described.

FIGS. 2 to 14 are partially sectional views of a semiconductor LD illustrating each fabricating step in the method for manufacturing a semiconductor LD according to the present invention.

In the fabricating steps, since the n-GaN substrate 12 and layers to the p-side guide layer 32 sequentially laminated thereon do not change during the fabricating steps, these are omitted from each drawing, and only cross-sections of layers above them, including a part of the p-side guide layer 32 are shown, First, using a metal-organic chemical vapor deposition method (hereafter abbreviated as "MOCVD"), an n-GaN layer is formed at a growing temperature of, for example, 1000° C. as the buffer layer 14.

Then, an n-$Al_{0.07}Ga_{0.93}N$ layer as the first n-clad layer 16, an n-$Al_{0.045}Ga_{0.955}N$ layer as the second n-clad layer 18, an n-$Al_{0.015}Ga_{0.985}N$ layer as the third n-clad layer 20, an i-$In_{0.02}Ga_{0.98}N$ layer as the n-side light guiding layer 22, and an i-$In_{0.02}Ga_{0.98}N$ layer as the n-side SCH layer 24 are sequentially formed; and thereon, an i-$In_{0.12}Ga_{0.88}N$ layer as the well layer 26a, an i-$In_{0.02}Ga_{0.98}N$ layer as the barrier layer 26b, and an i-$In_{0.12}Ga_{0.88}N$ layer as the well layer 26c are sequentially formed to constitute the active layer 26.

Next, a wafer wherein an i-$In_{0.02}Ga_{0.98}N$ layer as the p-side SCH layer 28, a p-$Al_{0.2}Ga_{0.8}N$ layer as the electron barrier layer 30, a p-$Al_{0.2}Ga_{0.8}N$ layer 70 as the p-side light guiding layer 32, a p-$Al_{0.07}Ga_{0.93}N$ layer 72 as the p-clad layer 34, and a p-GaN layer 74 as the contact layer 36 are sequentially laminated on the active layer 26, is formed; and further on the p-GaN layer 74, a metal cap layer 75 is laminated as the cap layer. For the ease of description, the laminated structure including the metal cap layer 75 is referred to as a "semiconductor laminated structure".

The metal cap layer 75 is formed of Au, Cr, or the like, and has a thickness of 5 nm to 250 nm, preferably 20 nm to 50 nm.

Figure 2:
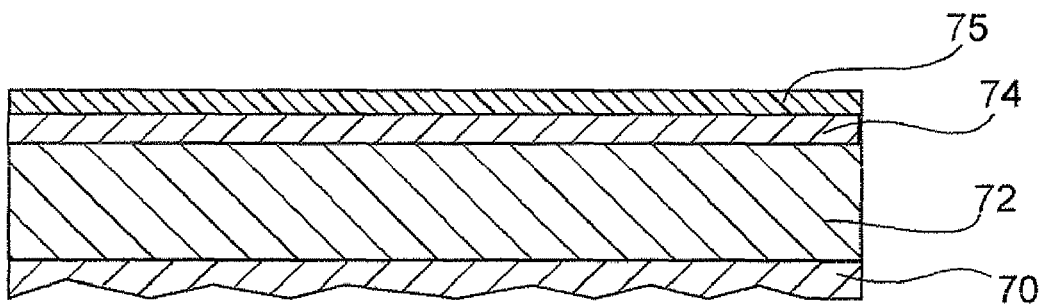
FIGS. 2 to 14 are partially sectional views of a semiconductor LD illustrating each fabricating step in the method for manufacturing a semiconductor LD according to the present invention.

FIG. 2 shows the result of this step.

On the side where the metal cap layer 75 contacts the contact layer 36, a thin Ti layer, which has high adhesiveness to the contact layer 36, can be provided, and Au, Cr, or the like can be laminated on the Ti layer.

Figure 3:
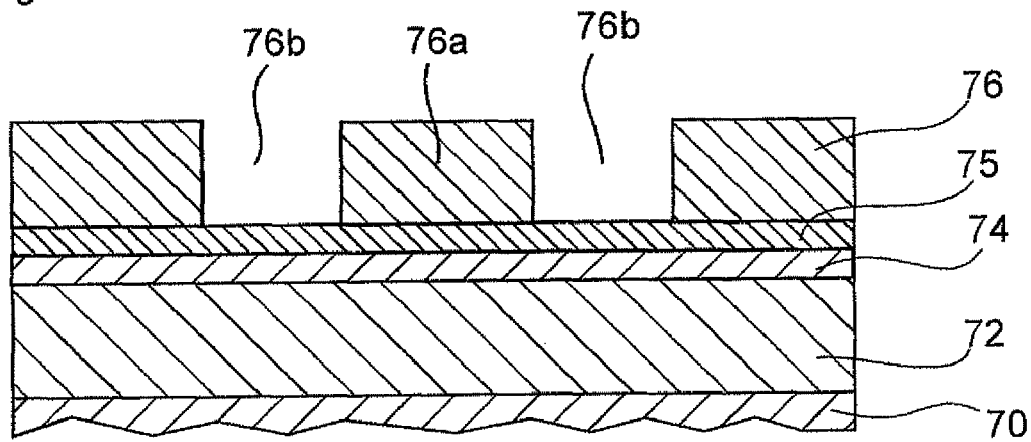

Next, referring to FIG. 3, a resist is applied to the entire surface of the semiconductor laminated structure on which the metal cap layer 75 has been laminated, and a resist pattern 76, wherein the resist is left on the portion 76a corresponding to the shape of the waveguide ridge 40 and the resist is removed from the portions 76b corresponding to the shape of the channels 38, is formed using a photolithography step. FIG. 3 shows the result of this step. In the first embodiment, the width of the portion 76a corresponding to the shape of the waveguide ridge 40 is 1.5 μm, and the width of the portions 76b corresponding to the shape of the channels 38 is 10 μm.

Figure 4:
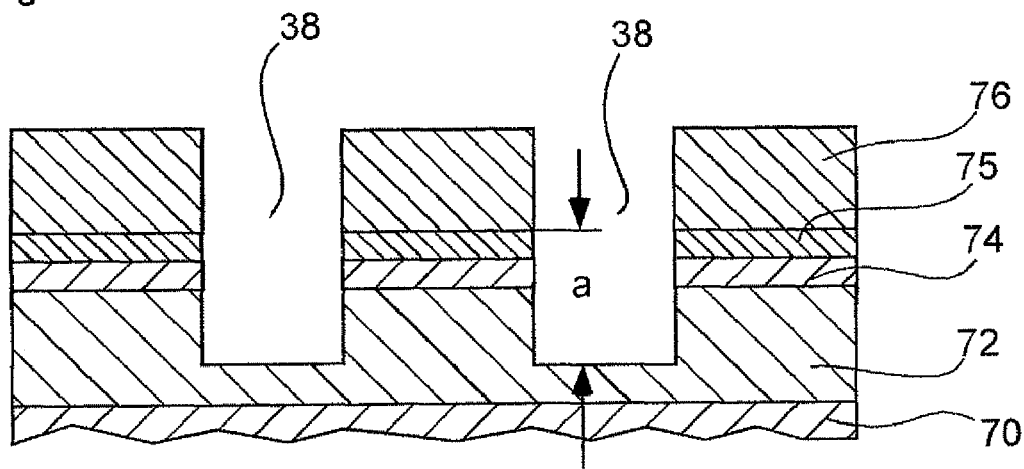

Next, referring to FIG. 4, using the resist pattern 76 as a mask, the metal cap layer 75, the p-GaN layer 74, and a part of the p-$Al_{0.07}Ga_{0.93}N$ layer 72 contacting the p-GaN layer 74 are etched to form channels 38 leaving a part of the p-$Al_{0.07}Ga_{0.93}N$ layer 72 to be the bottom.

The etching is conducted by, for example, dry etching, and the metal cap layer 75 is dry-etched, thereafter, the p-GaN layer 74 and a part of the p-$Al_{0.07}Ga_{0.93}N$ layer 72 on the side contacting the p-GaN layer 74 are etched by RIE (reactive ion etching) to form channels 38 leaving a part of the p-$Al_{0.07}Ga_{0.93}N$ layer 72 to be the bottom. In the first embodiment, the etching depth a in this case is about 500 nm (0.5 μm). By forming the channels 38, the waveguide ridge 40 and the electrode pad base 42 are formed. FIG. 4 shows the result of this step.

Figure 5:
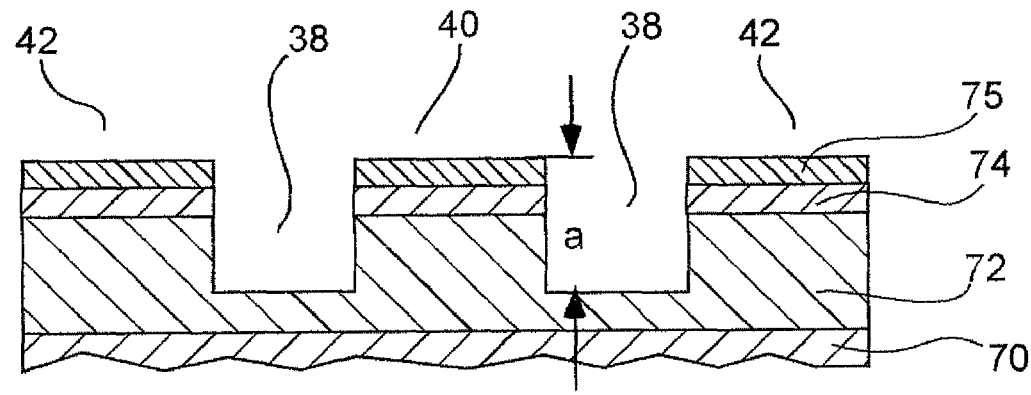

Next, referring to FIG. 5, the resist pattern 76 used in the previous etching is removed using an organic solvent or the like. The depth of the channel 38 at this time, specifically the height of the waveguide ridge 40 equals to the etching depth a, about 500 nm (0.5 μm). FIG. 5 shows the result of this step.

Figure 6:
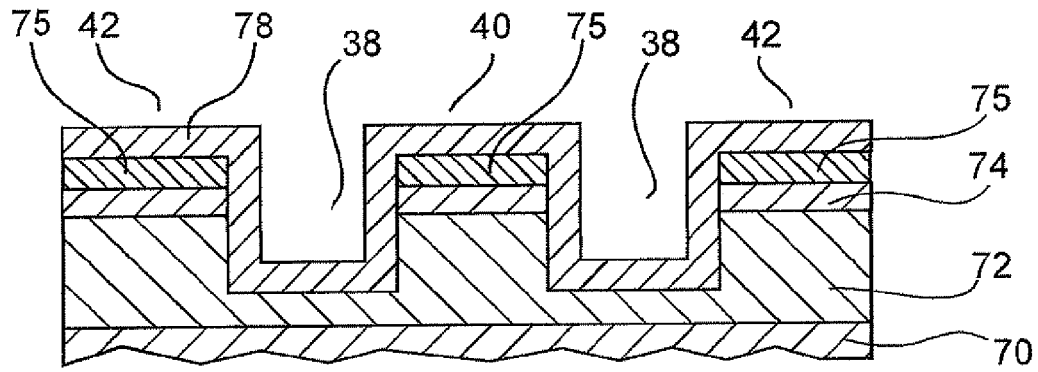

Next, referring to FIG. 6, an $SiO_2$ film 78 to be the first silicon oxide film 44 as the first insulating film having a thickness of, for example, 0.2 μm is formed. The $SiO_2$ film 78 coats the upper surface of the waveguide ridge 40, the inner surfaces of channels 38, and the upper surface of the electrode pad base 42. FIG. 6 shows the result of this step.

Although $SiO_2$ is used as the insulating film in this case, $SiO_x$ (0<x<2), SiN, SiON, $TiO_2$, $Ta_2O_5$, $Al_2O_3$, AlN, $ZrO_2$, $Nb_2O_5$, or the like can also be used other than $SiO_2$.

Figure 7:
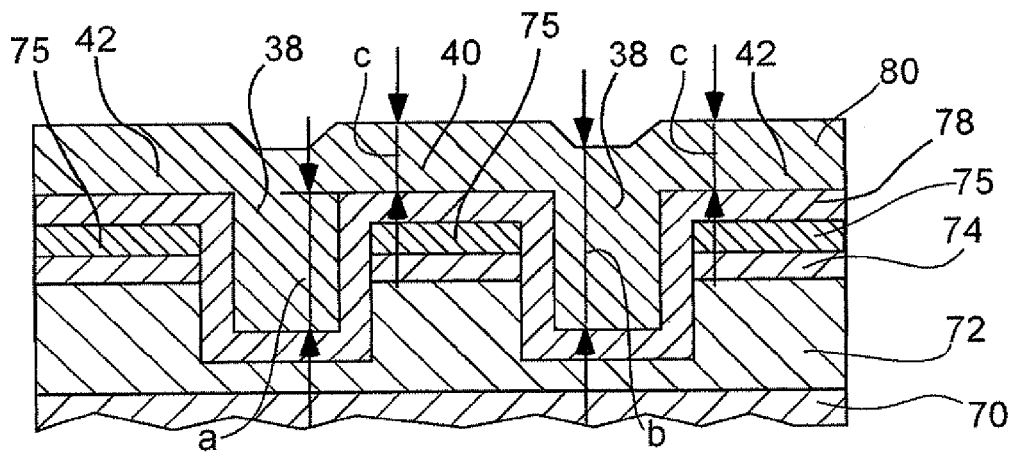

Next, referring to FIG. 7, a photo-resist is applied onto the entire surface of the wafer to form a resist film 80 so that the thickness b of the resist film in the channels 38 is larger than the thickness c of the resist film on the top of the waveguide ridge 40 and the top of the electrode pad base 42. For example, the resist film 80 is formed so that the thickness b is about 0.8 μm and the thickness c is about 0.4 μm.

In FIG. 7, the surface of the resist film 80 above the channels 38 is shown as to be depressed from the surface of the resist film 80 on the top of the waveguide ridge 40 and the top of the electrode pad base 42; however, if the surface of the resist film can be formed to be evenly flat, the relation of b>c is satisfied by itself.

However, even if the surface of the resist film 80 above the channels 38 is depressed from the surface of the resist film 80 on the top of the waveguide ridge 40 and the top of the electrode pad base 42 as FIG. 7 shows, the surface of the resist film 80 can be of any shape if the relation of b>c is satisfied.

The photo-resist is normally applied using a spin coating method. Specifically, the resist is dropped onto a wafer, and the wafer is allowed to spin to form a film having an even thickness.

The thickness of the resist film can be controlled by adequately adjusting the viscosity and dropping rate of the photo-resist, and the rotation speed and rotation time of the wafer.

As FIG. 7 shows, when steps or dents are formed on the surface of the wafer, the resist film is thinned in extruded portions, in this case, on the top of the waveguide ridge 40 and the top of the electrode pad base 42; is thickened in depressed portions, in this case, above the channels 38; and the difference in film thicknesses is affected by the viscosity of the photo-resist.

In the case of the wafer as shown in FIG. 7, when the viscosity of the photo-resist is low, the relationship between the etching depth a of the channels 38, the thickness b of the resist film 80 above the channels 38, and the thickness c of the resist film 80 on the top of the waveguide ridge 40 and the top of the electrode pad base 42 becomes close to b=c+a. This means that the surface of the resist film 80 can be substantially evenly flattened.

In the case when the surface of the resist film 80 is not substantially evenly flattened, and the surface of the resist above the channels 38 is depressed, the relationship approaches b=c if the viscosity of the photo-resist is high. This means that the thickness of the resist film 80 above the channels 38 is substantially equal to the thickness of the resist film 80 on the top of the waveguide ridge 40 and the top of the electrode pad base 42.

In the case when the surface of the resist film 80 is not substantially evenly flattened, and the surface of the resist above the channels 38 is depressed, the relationship becomes b>c unless the viscosity of the resist is considerably low; specifically, the thickness of the resist film 80 above the channels 38 is larger than the thickness of the resist film 80 on the top of the waveguide ridge 40 and the top of the electrode pad base 42.

As described above, by adequately setting the viscosity of the resist and the rotation speed of the wafer, the relationship between the thickness b of the resist film 80 above the channels 38 and the thickness c of the resist film 80 on the top of the waveguide ridge 40 and the top of the electrode pad base 42 can be set to a desired relationship, that is b>c. FIG. 7 shows the result of this step.

Figure 8:
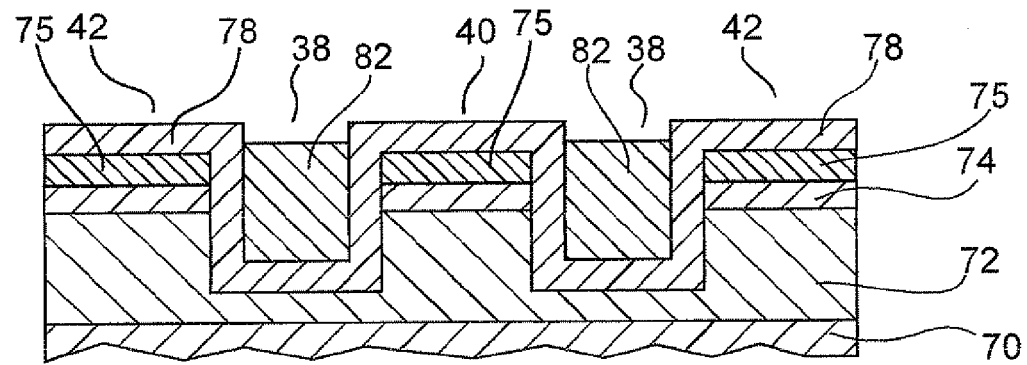

Next, referring to FIG. 8, the resist is evenly removed from the surface of resist film 80, and the resist film 80 on the top of the waveguide ridge 40 and the top of the electrode pad base 42 is completely removed leaving the resist film 80 above the channels 38 to form a resist pattern 82 wherein the $SiO_2$ film 78 is exposed on the top of the waveguide ridge 40 and the top of the electrode pad base 42.

For example, by dry etching using $O_2$ plasma, etching is performed a desired thickness, that is, so far as $SiO_2$ film 78 on the top of the waveguide ridge 40 and the top of the electrode pad base 42 is completely exposed, and while the surface of the resist film 80 is left to be higher than the upper surface of the metal cap layer 75; in the first embodiment, for example, about 400 nm.

In the first embodiment, etching is performed so that the surface of the resist film 80 is left to be higher than the upper surface of the metal cap layer 75. However, since the resist film 80 has such a thickness that the surface thereof is left to be higher than the upper surface of the second semiconductor layer, specifically in the first embodiment, since the p-clad layer 34 and the contact layer 36 are included as the second semiconductor layer, it is sufficient to etch so as to leave the resist film 80 to be higher than the upper surface of the contact layer 36.

The resist film 80 is formed so that the thickness of the resist film 80 above the channels 38 is about 800 nm, and the thickness of the resist film 80 on the top of the waveguide ridge 40 and the top of the electrode pad base 42 is about 400 nm. Therefore, if the resist is etched off by about 400 nm from the surface of the resist film 80, the resist film 80 on the top of the waveguide ridge 40 and the top of the electrode pad base 42 is removed, the upper surface of the $SiO_2$ film 78 is exposed, the surface of the resist film 80 above the channels 38 is formed at the location of the height of about half the thickness of the $SiO_2$ film 78, and the remaining resist film becomes the resist pattern 82 as the second resist pattern.

The discontinuation of etching when etching is evenly performed from the surface of the resist film 80, for example, the control of the etching quantity is accurately performed by performing the dry etching while observing, from outside of the etching chamber, the intensity of excitation light of a wavelength of 451 nm generated by CO formed when the resist film is removed by dry etching using $O_2$ plasma.

Since etching can be performed while accurately detecting the etching quantity of the resist film 80, the resist pattern 82, from which the resist film 80 on the top of the waveguide ridge 40 and the top of the electrode pad base 42 is removed, can be formed leaving the resist films in the channels 38. FIG. 8 shows the result of this step.

Figure 9:
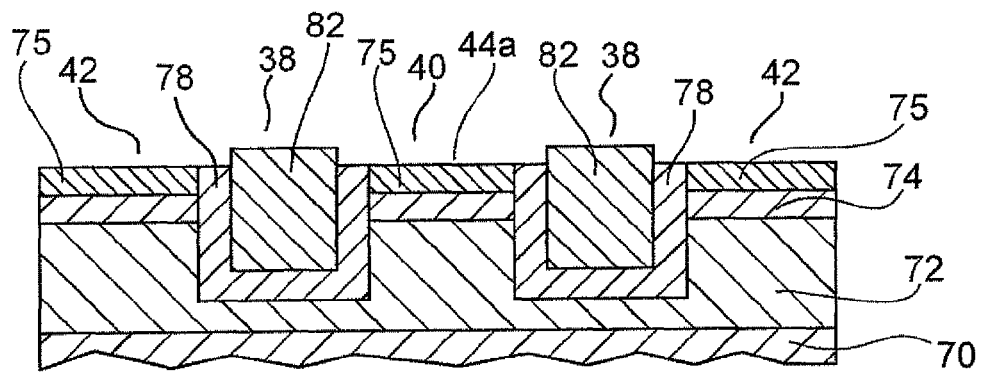

Next, referring to FIG. 9, the exposed $SiO_2$ film 78 is evenly etched from the surface using the resist pattern 82 as a mask to completely removing the $SiO_2$ film 78 formed on the top of the waveguide ridge 40 and the top of the electrode pad base 42 leaving the $SiO_2$ film 78 formed on the sides and the bottoms of the channels 38. On the top of the waveguide ridge 40, an opening 44a is surely formed in the $SiO_2$ film 78.

Etching in this case can be performed using dry etching, such as reactive ion etching using $CF_4$ or the like, or wet etching using buffered hydrofluoric acid or the like.

In this step, when the $SiO_2$ film 78 is removed by dry etching, the metal cap layer 75 coats the p-GaN layer 74 as the contact layer 36. Thereby, damages due to dry etching do not affect the p-GaN layer 74. Therefore, when the LD 10 is completed, no damages occur in the contact layer 36. Therefore, the elevation of the contact resistance caused by damages due to dry etching can be suppressed. In addition, the yield of the LD 10 can be raised.

The material of the metal cap layer 75 can be any material as long as it is not etched by an etchant for etching the insulating film in this step, and can be wet-etched.

In these cases, the accurate etching quantity can be controlled using the following method:

For example, when the $SiO_2$ film 78 is dry-etched using a gas containing fluorine, such as $CF_4$ gas, etching can be discontinued by observing the intensity of the light having a wavelength of about 390 nm generated from $SiF_2$ formed by Si in the $SiO_2$ film 78 and F in the etching gas.

Also when the SiO$_2$ film 78 is wet-etched by buffered hydrofluoric acid or the like, etching can be discontinued by confirming that the remaining thickness of the SiO$_2$ film 78 became zero by inputting laser beams of a single wavelength from the location facing the surface of the wafer to the SiO$_2$ film 78 formed on the top of the waveguide ridge 40 and the top of the electrode pad base 42, and measuring the intensity of reflected light. FIG. 9 shows the result of this step.

Figure 10:
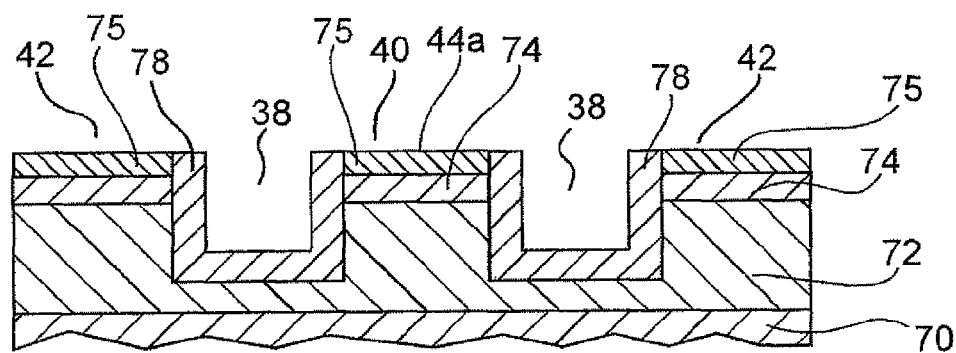

Next, referring to FIG. 10, the resist pattern 82 is removed by wet etching using an organic solvent. FIG. 10 shows the result of this step.

Further, the metal cap layer 75 is removed by wet etching. When the metal cap layer 75 is formed of Au, it is removed using aqua regia; and when it is formed of Cr, it is removed using hydrochloric acid. In the first embodiment, although Au and Cr are described as examples of materials for the metal cap layer, the materials are not limited to Au or Cu, but materials that can be removed using an etchant not affecting the insulating film of the sidewalls of the waveguide ridge 40 can be similarly used as the materials for the metal cap layer.

Figure 11:
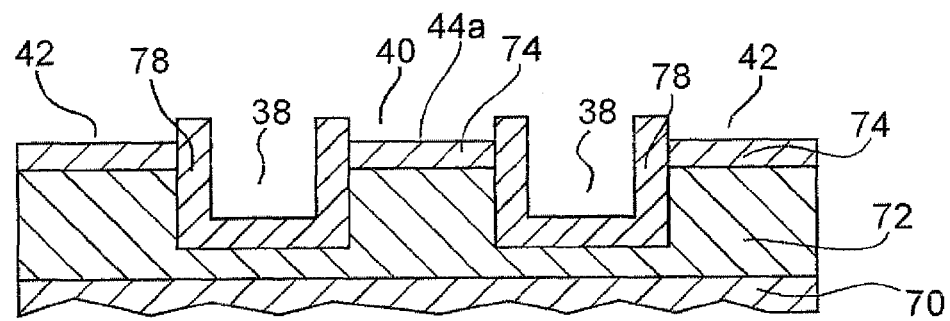

When the Ti layer is used on the side contacting the contact layer 36, it is removed using HF-containing etching solution. In this case, however, since the SiO$_2$ film is also etched off, it is required that the Ti layer is thinned. In the first embodiment, the thickness of the SiO$_2$ film is 200 nm, and for such a thickness of the SiO$_2$ film, the thickness of the Ti layer is preferably not less than 5 nm and not more than 30 nm. FIG. 11 shows the result of this step.

Figure 12:
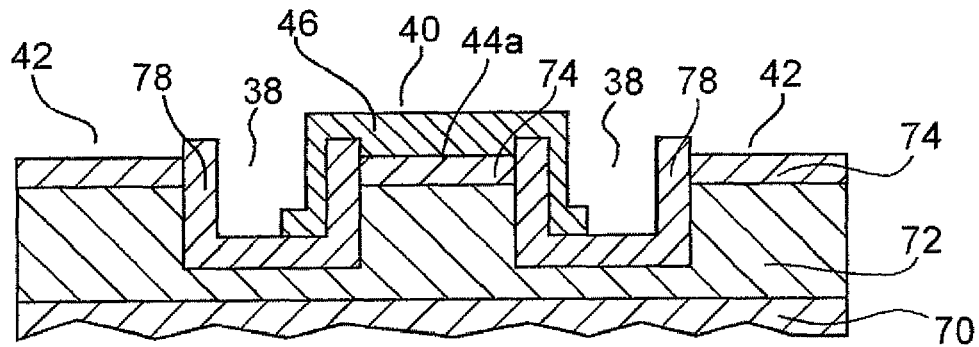

Next, referring to FIG. 12, a p-side electrode 46 is formed on the top of the waveguide ridge 40.

First, a resist is applied onto the entire surface of the wafer; using a photolithography process, a resist pattern (not shown) having openings for the upper surface of the p-GaN layer 74, which is the uppermost layer of the waveguide ridge 40, the sidewalls of the waveguide ridge 40, and a part of the bottoms of the channels 38 is formed; an electrode layer composed of a laminated structure of Pt and Au is formed on the resist pattern using, for example, a vacuum vapor deposition method; and then, the resist film and the electrode layer formed thereon are removed using a liftoff method to form the p-side electrode 46.

Since the entire upper surface of the p-GaN layer 74 on the top of the waveguide ridge 40 is exposed by the opening 44*a* without being coated with the SiO$_2$ film 78, the contact area between the p-side electrode 46 and the p-GaN layer 74 is not shrunk during the formation of the opening 44*a*.

Therefore, the elevation of the contact resistance due to the shrinkage of the contact area between the p-side electrode 46 and the p-GaN layer 74 can be prevented.

The upper ends of the SiO$_2$ films 78 that coat the both sides of the channels 38 are slightly protruded from the upper surface of the p-GaN layer 74. The p-side electrode 46 is formed so as to contact closely the upper surface of the p-GaN layer 74, to coat the upper ends of the SiO$_2$ films 78 so as to put into the upper ends, and further to extend through the SiO$_2$ films 78 on the sidewalls of the waveguide ridge 40 and onto a part of the SiO$_2$ films 78 on the bottoms of the channels 38, FIG. 12 shows the result of this step.

Next, a second silicon oxide film 48 is formed.

Figure 13:
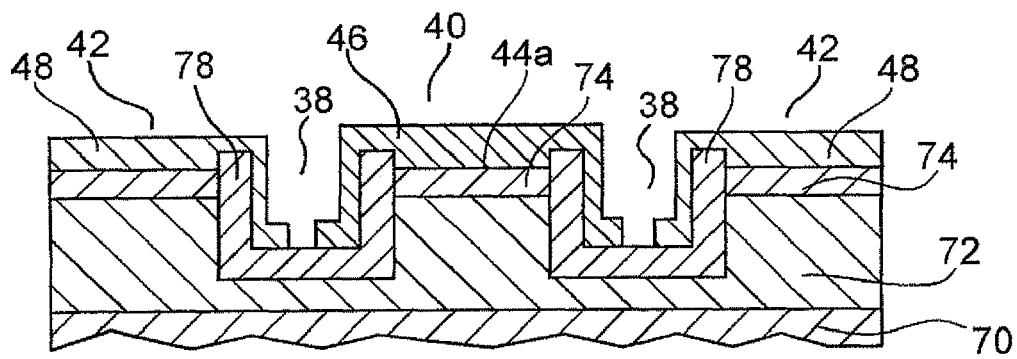

Referring to FIG. 13, a resist is first applied onto the entire surface of the wafer; a resist pattern (not shown) having openings is formed on the portion excluding the p-side electrode 46 using a photolithography process, specifically, the upper surface of the electrode pad base 42, the sides of the electrode pad base 42 in the channels 38, and a part of the bottom of the channels 38; an SiO$_2$ film having a thickness of 100 nm is formed by vapor deposition on the entire surface of the wafer; and the resist film formed on the p-side electrode 46 and the SiO$_2$ film formed on the resist film are removed using a lift-off process to form a second silicon oxide film 48 formed of the SiO$_2$ film. FIG. 13 shows the result of this step.

In this case, the insulating film may be SiO$_x$ (0<x<2), SiN, SiON, TiO$_2$, Ta$_2$O$_1$, Al$_2$O$_3$, AlN, ZrO$_2$, Nb$_2$O$_5$, or the like, rather than SiO$_2$.

Figure 14:
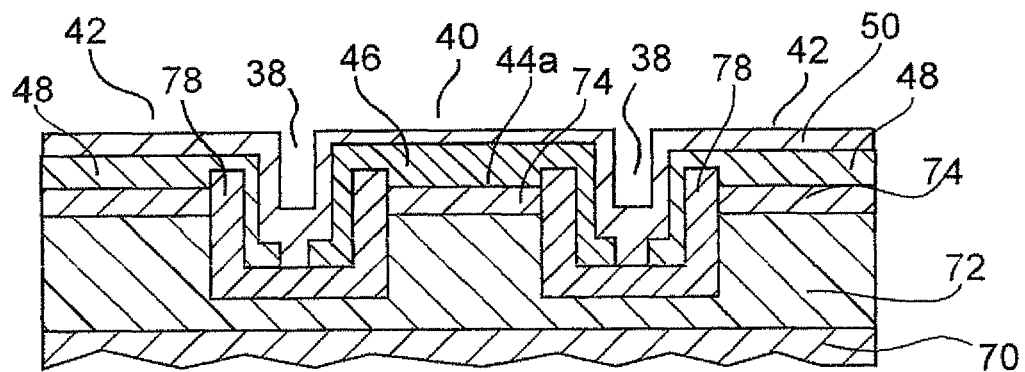

Finally, referring to FIG. 14, a metal film composed of Ti, Pt, and Au is laminated on the p-side electrode 46, the channels 38, and the second silicon oxide film 48 to form a pad electrode 50 using a vacuum vapor deposition method. FIG. 14 shows the result of this step.

First Modification

Figure 15:
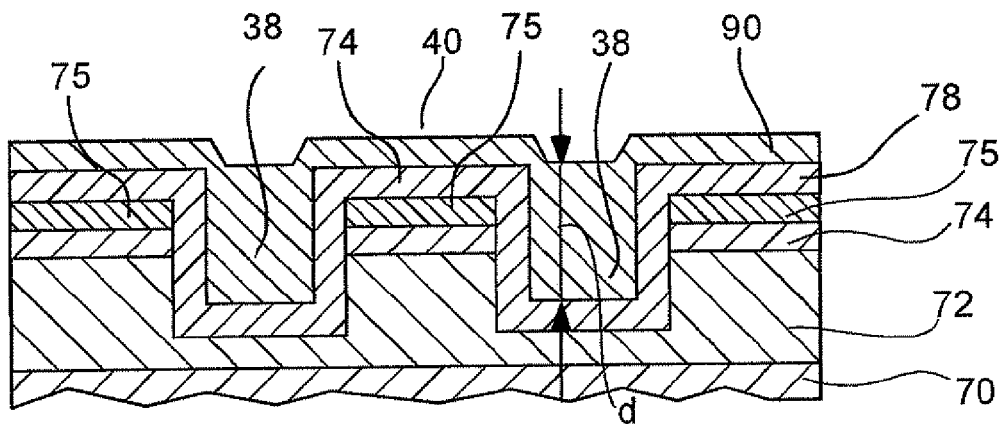
FIGS. 15 to 17 are partially sectional views illustrating each manufacturing step on another method for manufacturing a semiconductor LD according to the present invention.
Figure 16:
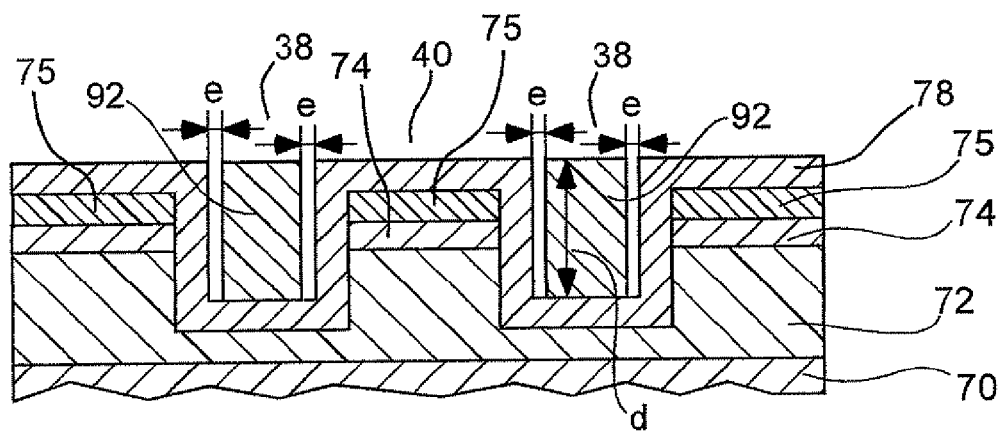
Figure 17:
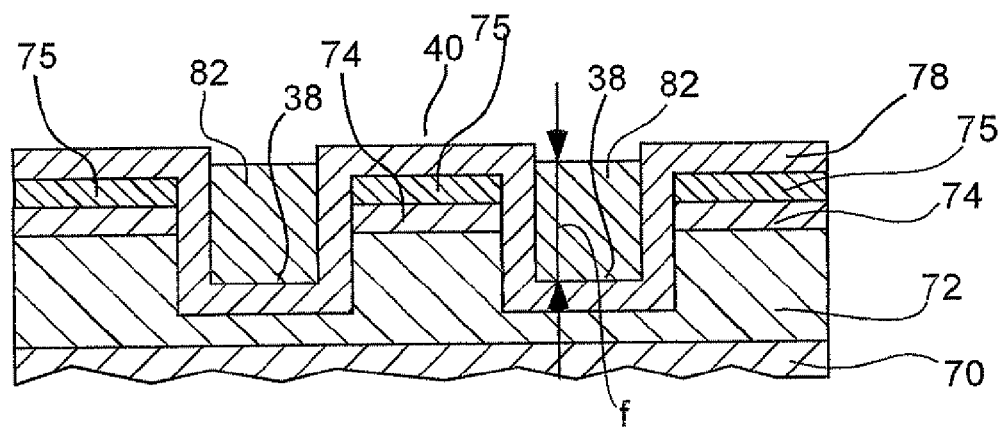

FIGS. 15 to 17 are partially sectional views illustrating each manufacturing step on another method for manufacturing a semiconductor LD according to the present invention.

Among manufacturing steps described above, steps shown in FIGS. 1 to 6 are same also in the first modification. The steps shown in FIGS. 7 and 8 in the above description are substituted by the steps shown in FIGS. 15 to 17.

In the step shown in FIG. 6, after the upper surface of the waveguide ridge 40, the inner surfaces of channels 38, and the upper surface of the electrode pad base 42 have been coated by the SiO$_2$ film 78, referring to FIG. 15, a photo-resist mainly consisting of a novolak resin is applied onto the entire surface of the wafer to form a resist film 90 wherein the surface thereof in channels 38 adjoining the waveguide ridge 40 has the substantially same height as the upper surface of the SiO$_2$ film 78.

In this embodiment, the thickness d of the resist film 90 in the channels 38, that is, the height d from the surface of the SiO$_2$ film 78 disposed on the bottom of the channels 38 to the surface of the resist film 90 is, for example, about 500 nm (0.5 µm).

In this case, the method for fabricating the resist film 90 whose thickness d is accurately controlled is the same as the method for fabricating the resist film 80 in FIG. 7 as described above, and the thickness d of the resist film 90 in the channels 38 can be set to a desired value by appropriately setting the viscosity of the resist and the rotation speed of the wafer. FIG. 15 shows the result of this step.

Next, referring to FIG. 16, a resist pattern 92 is formed of a resist film 90 using a photolithography process. In the resist pattern 92, the resist film 90 is left on a part of the SiO$_2$ film 78 at the bottom in the channels 38; a predetermined gaps e are produced between the resist film 90 in the channels 38 and the SiO$_2$ film 78 on the sidewalls of the waveguide ridge 40, and between the resist film 90 and the SiO$_2$ film 78 on the sidewalls of the electrode pad base 42 to isolate them, and the surface of the SiO$_2$ film 78 is evenly exposed on the top of the waveguide ridge 40 and the top of the electrode pad base 42 is formed. FIG. 16 shows the result of this step.

Next, referring to FIG. 17, by heat-treating the wafer, for example, by heating the wafer in air at a temperature of 140° C. for 10 minutes, the photo-resist is fluidized and the predetermined gaps e produced between the resist film 90 in the channels 38 and the SiO$_2$ film 78 on the sidewalls of the waveguide ridge 40, and between the resist film 90 and the SiO$_2$ film 78 on the sidewalls of the electrode pad base 42 is removed; specifically, by allowing the resist film to contact the SiO$_2$ film 78 on the sidewalls of the channels 38, a resist pattern 82 wherein the top of the waveguide ridge 40 and the top of the electrode pad base 42 are exposed leaving the resist film in the channels 38, is formed. FIG. 17 shows the result of this step.

The height f of the surface of the resist film disposed in the channels 38 of the resist pattern 82 is approximately set to be lower than the surface of the SiO$_2$ film 78 on the top of the waveguide ridge 40 and the top of the electrode pad base 42, and higher than the metal cap layer 75 on the top of the waveguide ridge 40 and the top of the electrode pad base 42. In this embodiment, f is set to be about 400 nm.

To achieve this, if the volume of the resist film is not changed before and after heat treatment in this step, the gap e must be set so that a desired f value can be obtained by considering that the sectional area of the resist pattern 92 and the sectional area of the resist pattern 82 in the cross-sections shown in FIGS. 16 and 17, respectively are identical.

In FIG. 16, although the gaps e of the resist pattern 92 are produced on the both sides of the resist film in the channels 38, the gap can be produced on a side of the resist film as long as the gap e is set so that a desired f value can be obtained.

The subsequent steps are identical to the steps after shown from FIG. 9 and onward described above.

In the method for manufacturing an LD 10 in the first embodiment, a semiconductor laminated structure is formed by laminating further a metal cap layer 75 on a wafer formed by laminating semiconductor layers, a waveguide ridge 40 and an electrode pad base 42 are formed in the semiconductor laminated structure by forming channels 38, and an SiO$_2$ film 78 is formed on the entire surface of the wafer.

Next, a resist is applied onto the entire surface of the wafer to form a resist film 80 so that the thickness of the resist film 80 in the channels 38 is larger than the thickness of the resist film 80 on the top of the waveguide ridge 40 and the top of the electrode pad base 42.

Then, the resist is evenly removed from the surface of the resist film 80, and the resist film 80 on the top of the waveguide ridge 40 and the top of the electrode pad base 42 is removed leaving the resist film 80 in the channels 38 to form a resist pattern 82 wherein the top of the waveguide ridge 40 and the top of the electrode pad base 42 are exposed.

Next, the exposed SiO$_2$ film 78 is evenly dry-etched from the surface using the resist pattern 82 as a mask to remove the SiO$_2$ film 78 formed on the top of the waveguide ridge 40 and the top of the electrode pad base 42 leaving the SiO$_2$ film 78 formed on the sides and bottoms of the channels 38; and on the top of the waveguide ridge 40, an opening 44a that surely expose the metal cap layer 75 is formed in the SiO$_2$ film 78.

Then, after removing the resist pattern 82, the metal cap layer 75 is removed by wet etching; and a p-side electrode 46 is formed on the top of the waveguide ridge 40.

In the method for fabricating the LD, the upper surface of the semiconductor layer contacting the p-side electrode 46, in this embodiment, the p-GaN layer 74, which becomes the contact layer 36, is surely exposed by the opening 44a of the SiO$_2$ film 78, and the SiO$_2$ film 78 does not remain on the upper surface of the p-GaN layer 74. Therefore, the contact area between the p-side electrode 46 and the contact layer 36 is not shrunk, and the operating voltage is not elevated. Furthermore, when the SiO$_2$ film 78 formed on the top of the waveguide ridge 40 is removed by dry etching, since the contact layer 36 is coated by the metal cap layer 75, the contact layer 36 is not damaged by etching. Consequently, the elevation of the contact resistance caused by damage due to dry etching can be suppressed, and the operating voltage is not elevated. Therefore, a high-performance LD 10 can be fabricated at a high yield using simple steps.

As described above, the method for manufacturing a semiconductor optical device according the present invention includes sequentially laminating a first semiconductor layer of a first conductivity type, an active layer, a second semiconductor layer of a second conductivity type, and a cap layer on a semiconductor substrate, to form a semiconductor laminated structure; applying a resist onto the surface of the semiconductor laminated structure, and forming a first resist pattern with a stripe-shaped resist film portion having a width corresponding to a waveguide ridge using a photolithography process; etching off the cap layer using the first resist pattern as a mask to expose the second semiconductor layer; removing a part of the upper surface side of the second semiconductor layer by dry etching using the first resist pattern as a mask to form a dent leaving a part of the second semiconductor layer on the bottom, and to form the waveguide ridge; forming a first insulating film on the surface of the semiconductor laminated structure containing the dent and the waveguide ridge having the cap layer on the uppermost surface after removing the first resist pattern; forming a second resist pattern, the second resist pattern exposing the surface of the first insulating film on the top of the waveguide ridge, and burying the first insulating film in the dent adjoining the waveguide ridge by a resist film having a surface higher than the surface of the second semiconductor layer of the waveguide ridge and lower than the surface of the first insulating film on the top of the waveguide ridge; removing the first insulating film by dry etching using the second resist pattern as a mask to expose the surface of the cap layer of the waveguide ridge; removing the cap layer by wet etching to expose the second semiconductor layer; and forming an electrode layer on the surface of the exposed second semiconductor layer of the waveguide ridge.

Therefore, the second resist pattern formed in the dent adjoining the waveguide ridge has a surface higher than the surface of the cap layer of the waveguide ridge, and lower than the surface of the first insulating film on the top of the waveguide ridge. When the first insulating film on the top of the waveguide ridge is removed by dry etching using the second resist pattern, the cap layer on the top of the waveguide ridge is exposed leaving the first insulating film on the side of the waveguide ridge and in the dent.

Furthermore, when the cap layer is removed by wet etching, the second semiconductor layer is exposed, and an electrode layer is formed on the exposed second semiconductor layer. By this simple step, the second semiconductor layer can be joined to the electrode layer without the shrinkage of the contact area.

Since the cap layer has been formed on the second semiconductor layer of the waveguide ridge when the first insulating film by dry etching using the second resist pattern as the mask is removed, the damage of the second semiconductor layer due to dry etching can be prevented, and the elevation of the contact resistance of the second semiconductor layer caused by dry etching can be suppressed.

Therefore, a high-performance semiconductor optical device can be fabricated at a high yield using simple steps.

Second Embodiment

Figure 18:
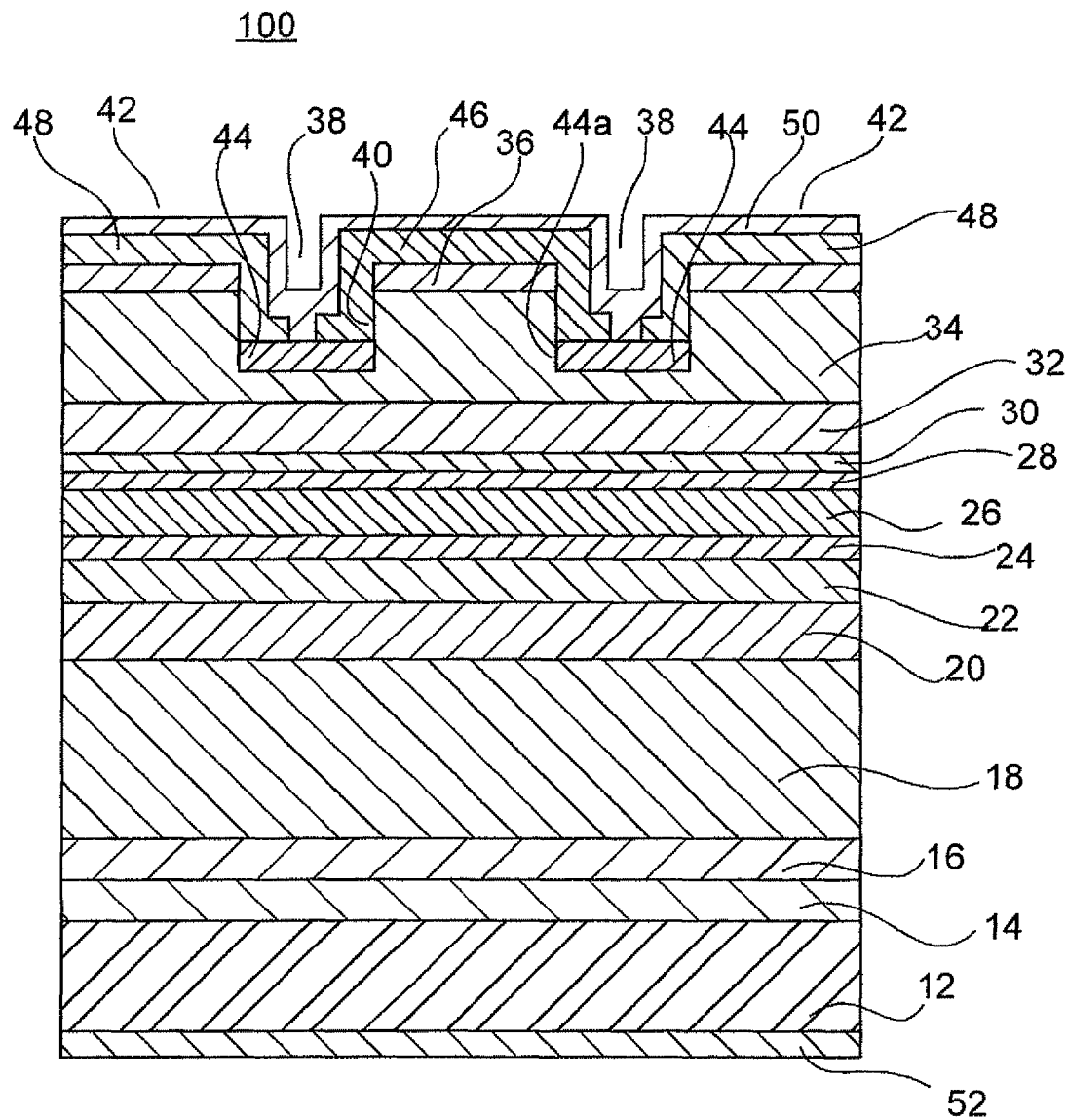
FIG. 18 is a sectional view of a semiconductor LD according to an embodiment of the present invention.

FIG. 18 is a sectional view of a semiconductor LD according to an embodiment of the present invention.

In FIG. 18, the LD 100 if a blue-violet LD of a waveguide ridge type, and has a configuration substantially the same as the configuration of the LD 10 described in the first embodiment.

The difference of the LD 100 from the LD 10 is that the both side and bottoms of the channels 38 including the sidewalls of the waveguide ridge 40 and the electrode pad base 42 are coated with the first silicon oxide film 44 in the LD 10; however, the both sides of the channels 38 including the sidewalls of the waveguide ridge 40 and the electrode pad base 42 are not coated with the first silicon oxide film 44, and only the bottoms of the channels 38 are coated with the first silicon oxide film 44 in the LD 100.

Therefore, the p-side electrode 46 directly contacts the upper surface of the contact layer 36 and the sidewalls of the waveguide ridge 40, and extends to the bottoms of the channels 38. The second silicon oxide film 48 also directly coats the sidewalls of the waveguide ridge 40, and extends to the upper surface of the electrode pad base 42. The other configuration is substantially the same as the configuration of the LD 10.

Next, a method for fabricating the LD 100 will be described.

FIGS. 19 to 27 are partially sectional views illustrating each fabricating step of a semiconductor LD according to one embodiment of the present invention.

Also in these fabricating steps, since the n-GaN substrate 12 and layers to the p-side guide layer 32 sequentially laminated thereon do not change during the fabricating steps, these are omitted from each drawing, and only cross-sections of layers above them, including a part of the p-side guide layer 32 are shown.

First, on the GaN substrate 12 of which surface is washed in advance by thermal cleaning or the like, using MOCVD method, an n-GaN layer is formed at a growing temperature of, for example, 1000° C. as the buffer layer 14. Then, an n-$Al_{0.07}Ga_{0.93}N$ layer as the first n-clad layer 16, an n-$Al_{0.045}Ga_{0.955}N$ layer as the second n-clad layer 18, an n-$Al_{0.015}Ga_{0.985}N$ layer as the third n-clad layer 20, an i-$In_{0.02}Ga_{0.98}N$ layer as the n-side light guiding layer 22, and an i-$In_{0.02}Ga_{0.985}N$ layer as the n-side SCH layer 24 are sequentially formed; and thereon, an i-$In_{0.12}Ga_{0.88}N$ layer as the well layer 26a, an i-$In_{0.02}Ga_{0.98}N$ layer as the barrier layer 26b, and an i-$In_{0.12}Ga_{0.88}N$ layer as the well layer 26c are sequentially formed to constitute the active layer 26.

Next, on the active layer 26, an i-$In_{0.02}Ga_{0.98}N$ layer as the p-side SCH layer 28, a p-$Al_{0.2}Ga_{0.8}N$ layer as the electron barrier layer 30, a p-$Al_{0.2}Ga_{0.8}N$ layer 70 as the p-side light guiding layer 32, a p-$Al_{0.07}Ga_{0.93}N$ layer 72 as the p-clad layer 34, and a p-GaN layer 74 as the contact layer 36 are sequentially laminated. A semiconductor laminated structure is formed in above steps.

Figure 19:
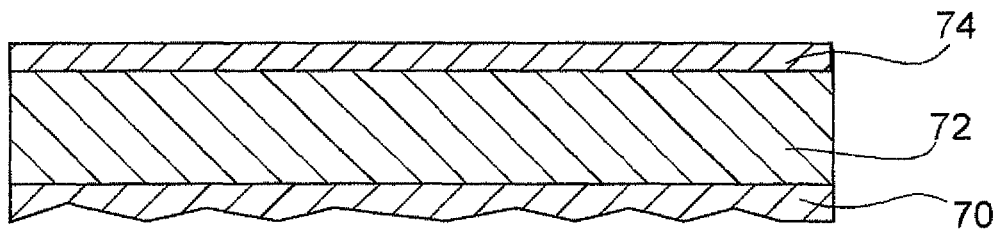
FIGS. 19 to 27 are partially sectional views illustrating each fabricating step of a semiconductor LD according to one embodiment of the present invention.

FIG. 19 shows the result of this step.

Figure 20:
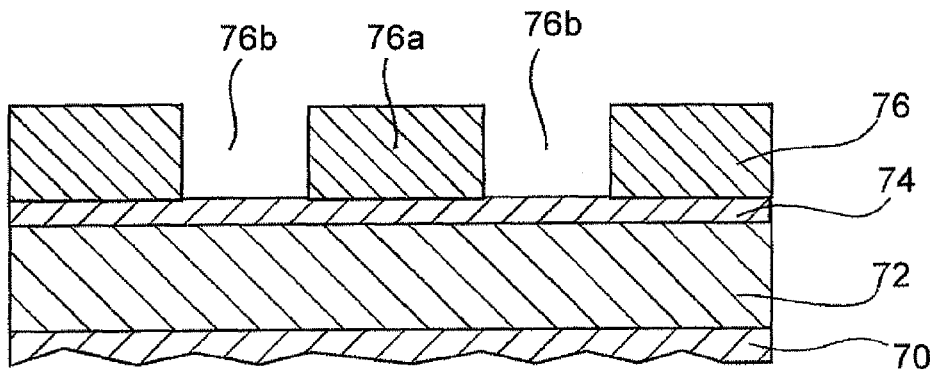

Next, referring to FIG. 20, a resist is applied onto the entire surface of the semiconductor laminated structure, and a resist pattern 76 from which the resist on the portion 76b of the shape corresponding the shape of the channels 38 is removed leaving the resist on the portion 76a of the shape corresponding the shape of the waveguide ridge 40 is as a first resist pattern formed by a photolithography process. FIG. 20 shows the result of this step.

Figure 21:
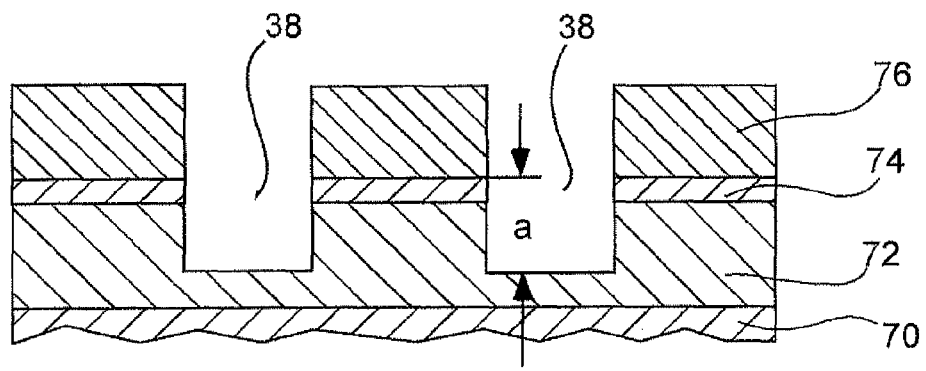

Next, referring to FIG. 21, the p-GaN layer 74, and a part of the p-$Al_{0.07}Ga_{0.93}N$ layer 72 contacting the p-GaN layer 74 are etched to form channels 38 leaving a part of the p-$Al_{0.07}Ga_{0.93}N$ layer 72 to be the bottom. The etching is conducted by RIE (reactive ion etching), and the p-GaN layer 74 and a part of the p-$Al_{0.07}Ga_{0.93}N$ layer 72 on the side contacting the p-GaN layer 74 is etched to form channels 38 leaving a part of the p-$Al_{0.07}Ga_{0.93}N$ layer 72 to be the bottom. FIG. 21 shows the result of this step.

Figure 22:
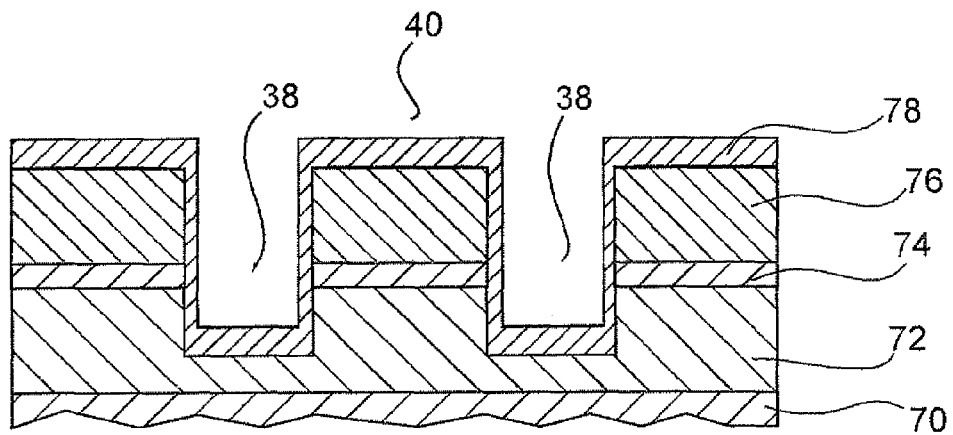

Next, referring FIG. 22, an $SiO_2$ film 78 to become a first silicon oxide film 44 as a first insulating film having a thickness of, for example, 0.s μm is formed on the entire surface of the wafer using a CVD method, a vacuum vapor deposition method, or a sputtering method, leaving the resist pattern 76 used in previous etching. The $SiO_2$ film 78 coats the upper surface of the waveguide ridge 40, the inner surfaces of the channels 38, and the upper surface of the electrode pad base 42. FIG. 22 shows the result of this step.

As a material for the insulating film in this case, the oxide of Si, Ti, Al, V, Zr, Nb, Hf, or Ta; or SiN, SiON, BN, SiC, AlN, TiN, or TiC can be used. The etching rates of these materials depend on the plain orientations. Specifically, when these materials are used to form an insulating film using a sputtering method, a vacuum vapor deposition method, or a CVD method, the quality of the film formed on the top of the waveguide ridge 40 and the bottoms of the channels 38 is different from the quality of the film formed on the sidewalls of the waveguide ridge 40. In other words, the etching rates are different; the etching rate of the film formed on the sidewalls of the waveguide ridge 40 is 50 to 100 times the etching rate of the film formed on the top of the waveguide ridge 40 and the bottoms of the channels 38.

Figure 23:
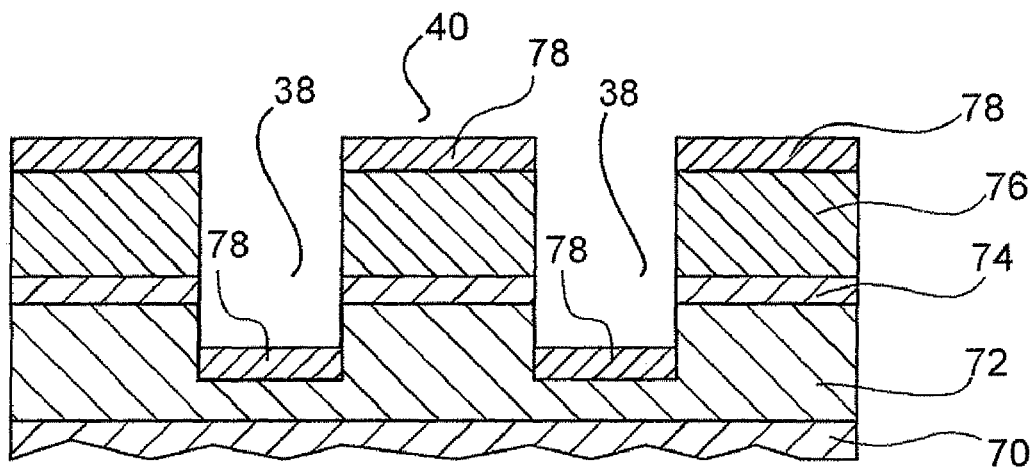

Next, referring to FIG. 23, when the previously formed $SiO_2$ film 78 is etched using an etching solution of BHF (16%): $H_2O$=1:100 for 10 seconds, the $SiO_2$ film 78 formed on the sidewalls of the waveguide ridge 40 is completely removed; however, the $SiO_2$ film 78 formed on the top of the waveguide ridge 40 and the bottoms of the channels 38 is little etched and remains.

FIG. 23 shows the result of this step.

Figure 24:
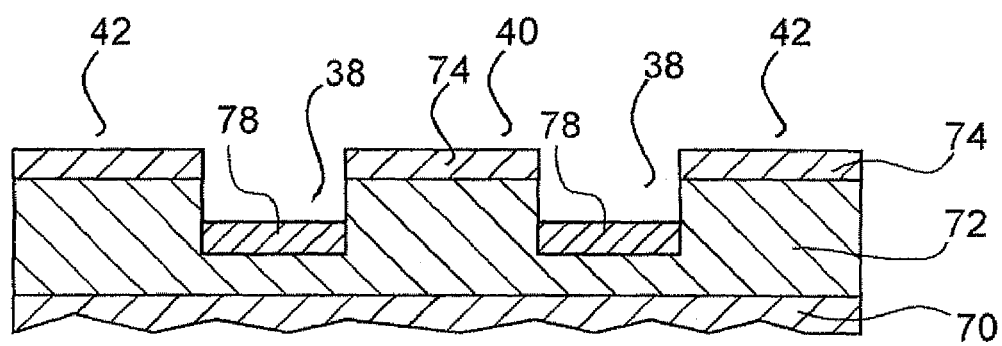

Next, referring to FIG. 24, the previously formed resist pattern 76 is removed by wet etching using an organic solvent or the like. The $SiO_2$ film 78 remaining on the resist pattern is also simultaneously removed, and only the $SiO_2$ film 78 formed on the bottoms of the channels 38 is left.

In this step, the portions to become the waveguide ridge 40 and the electrode pad base 42 are formed. FIG. 24 shows the result of this step.

Since no dry etching for exposing the upper surface of the P-GaN layer 74 is exposed in this step, no damages due to dry etching occur in the P-GaN layer 74. Therefore, the elevation of the contact resistance caused by the damages of the contact layer 36 composed of the P-GaN layer 74 due to dry etching can be suppressed.

Figure 25:
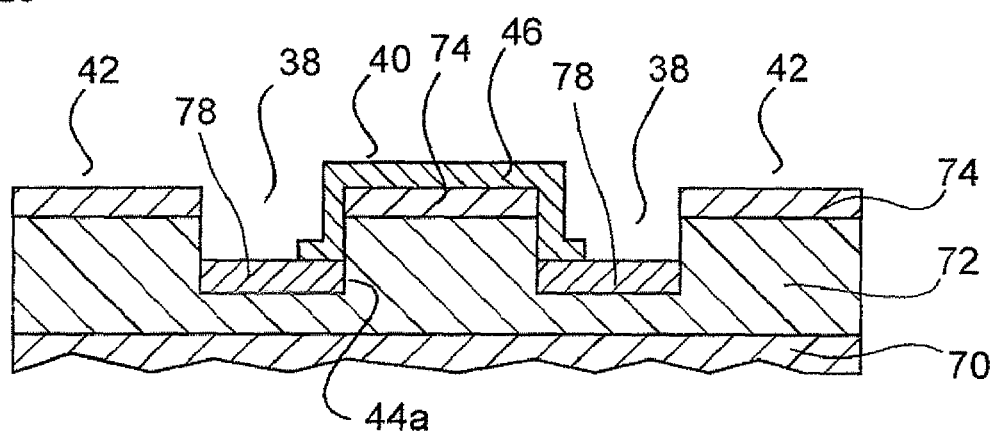

Next, referring to FIG. 25, a p-side electrode 46 is formed on the top of the waveguide ridge 40.

First, a resist is applied onto the entire surface of the wafer to form a resist pattern (not shown) having openings on the upper surface of the p-GaN layer 74, which is the uppermost layer of the waveguide ridge 40, the sidewalls of the waveguide ridge 40, and a part of the bottoms of the channels 38 using a photolithography process, an electrode layer composed of a laminated structure of Pt and Au is formed on the resist pattern using, for example, a vacuum vapor deposition method, and then the resist film and the electrode layer formed on the resist film are removed using a liftoff method to form a p-side electrode 46.

Since the upper surface of the p-GaN layer 74 on the top of the waveguide ridge 40 is not coated by the $SiO_2$ film 78 and the entire upper surface is exposed by the opening 44a, the contact area between the p-side electrode 46 and the p-GaN layer 74 is not shrunk when the opening 44a is formed.

Therefore, the elevation of the contact resistance caused by the shrinkage of the contact area between the p-side electrode 46 and the p-GaN layer 74 can be prevented, and the elevation of the contact resistance caused by the damages due to dry etching can also be suppressed. FIG. 25 shows the result of this step.

In this manufacturing method, no insulating films are formed on the sidewalls of the waveguide ridge 40, and the sidewalls of the waveguide ridge 40 directly contact the p-side electrode 46. Therefore, the case where in the p-side electrode 46 directly contacts the sidewalls of the p-clad layer 34 may be generated. However, even if wherein the p-side electrode 46 directly contacts the sidewalls of the p-clad layer 34, since the contact resistance of the p-clad layer 34 is high and little current flows, it is considered that no problems arise in the initial characteristics.

Figure 26:
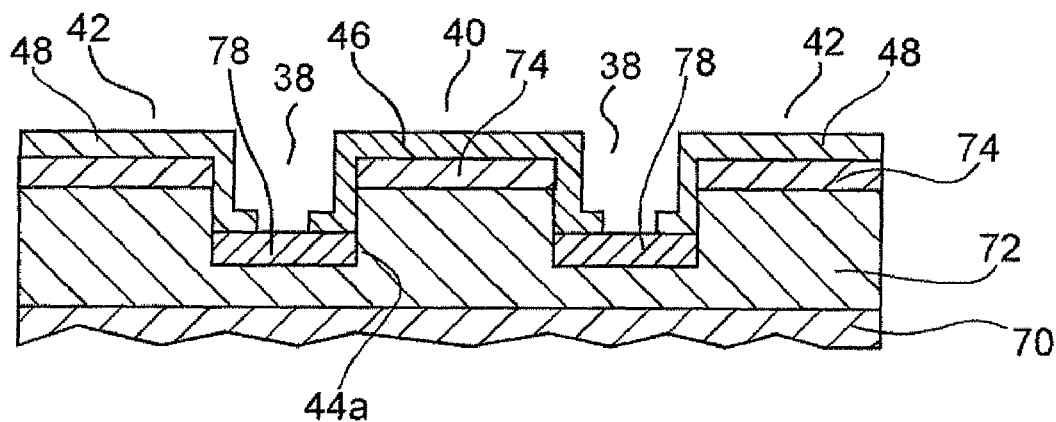

Next, a second silicon oxide film 48 is formed as a second insulating film. FIG. 26 shows the result of this step.

Figure 27:
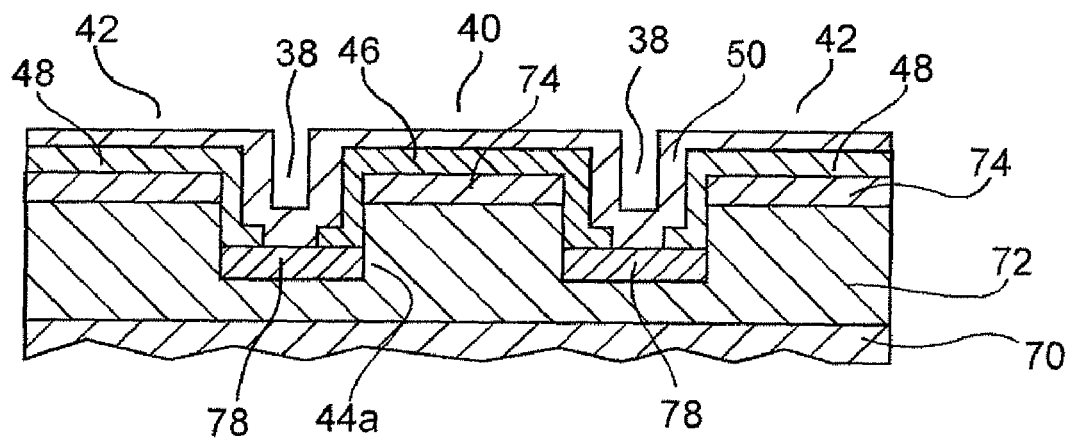

As a material for the insulating film in this case, such as the oxide of Si, Ti, Al, V, Zr, Nb, Hf, or Ta; or SiN, SiON, BN, SiC, AlN, TiN, or TiC can be used. Finally, a metal film composed of Ti, Pt and Au is laminated on the p-side electrode 46, the channels 38, and the second silicon oxide film 48 to form a pad electrode 50. FIG. 27 shows the result of this step.

The formation of the second silicon oxide film 48 and the formation of the pad electrode 50 are the same as described in the first embodiment.

In the method for manufacturing a semiconductor optical device according to the second embodiment, a first n-clad layer 16, a second n-clad layer 18, a third n-clad layer 20, an active layer 26, a p-clad layer 34, and a contact layer 36 are sequentially laminated on an n-type GaN substrate 12 to form a semiconductor laminated structure; then, a resist is applied on the surface of the semiconductor laminated structure to form a resist pattern 76 provided with a stripe-shaped resist-film portion having a width corresponding a waveguide ridge 40; and a waveguide ridge 40 is formed using the resist pattern 76 as a mask. Next, an $SiO_2$ film 78 is formed on the surface of the semiconductor laminated structure including the channels 38 and the waveguide ridge 40 leaving the resist pattern 76, and the $SiO_2$ film 78 on the sidewalls of the waveguide ridge 40 is removed leaving the $SiO_2$ film 78 in the channels 38 and on the top of the waveguide ridge 40 to expose the sidewalls of the waveguide ridge 40. Then, the resist pattern 76 and the $SiO_2$ film 78 remaining on the resist pattern 76 are removed using a liftoff method to expose the contact layer 36 to form a p-side electrode 46 on the surfaces of the contact layer 36 of the exposed waveguide ridge 40 and the p-clad layer 34. In the method for manufacturing a semiconductor optical device, the contact area between the p-side electrode 46 and the p-GaN layer 74 is not shrunk when the opening 44 a is formed. Furthermore, since no dry etching is used when the contact layer 36 of the top of the waveguide ridge 40 is exposed, no damages due to dry etching occur in the contact layer, and the elevation of the contact resistance can be suppressed. Therefore, a high-performance LD can be fabricated at a high yield using simple steps.

As described above, the method for manufacturing a semiconductor optical device according the present invention includes sequentially laminating a first semiconductor layer of a first conductivity type, an active layer, and a second semiconductor layer of a second conductivity type on a semiconductor substrate, to form a semiconductor laminated structure; applying a resist onto the surface of the semiconductor laminated structure, and forming a first resist pattern with a stripe-shaped resist film portion having a width corresponding to a waveguide ridge using a photolithography process; removing a part of the upper surface side of the second semiconductor layer by dry etching using the first resist pattern as a mask to form a dent leaving a part of the second semiconductor layer on the bottom, and to form the waveguide ridge; forming a first insulating film on the surface of the semiconductor laminated structure including the dent and the waveguide ridge leaving the first resist pattern; removing the first insulating film on the sides of the waveguide ridge leaving the first insulating film in the dent and on the top of the waveguide ridge to expose the sidewalls of the waveguide ridge; removing the resist pattern and the first insulating film left on the resist pattern using a liftoff method to expose the second semiconductor layer; and forming an electrode layer on the surface of the exposed second semiconductor layer of the waveguide ridge.

Therefore, using simple steps, the electrode layer can be joined to the second semiconductor layer without the shrinkage of the contact area. Furthermore, since no dry etching is used when the second semiconductor layer on the top of the waveguide ridge is exposed, no damages due to dry etching occur in the second semiconductor layer, and the elevation of the contact resistance can be suppressed. Therefore, a high-performance semiconductor optical device can be fabricated at a high yield using simple steps.

As described above, the method for manufacturing a semiconductor optical device according to the present invention is suitable for a method for manufacturing a semiconductor optical device provided with an electrode on the top of the waveguide ridge.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A method for manufacturing a semiconductor optical device, comprising:

sequentially laminating a first semiconductor layer of a first conductivity type, an active layer, a second semiconductor layer of a gallium nitride-based compound semiconductor material having a second conductivity type, and a metal cap layer on a semiconductor substrate, to form a semiconductor laminated structure;

applying a resist onto a surface of the semiconductor laminated structure, and forming a first resist pattern, with a stripe-shaped resist film portion having a width corresponding to a waveguide ridge, using photolithography;

etching and removing the metal cap layer, using the first resist pattern as a mask, thereby exposing the second semiconductor layer;

removing a part of the second semiconductor layer by dry etching, using the first resist pattern as a mask, thereby forming a dent, leaving a part of the second semiconductor layer on a bottom of the dent, and thereby forming the waveguide ridge;

forming an insulating film on the surface of the semiconductor laminated structure containing the dent, and the waveguide ridge having the metal cap layer on an uppermost surface, after removing the first resist pattern;

forming a second resist pattern, the second resist pattern exposing an upper surface of the insulating film on top of the waveguide ridge, and burying the insulating film in the dent adjoining the waveguide ridge with a resist film having a surface farther from the substrate than the surface of the second semiconductor layer of the waveguide ridge and closer to the upper substrate than the surface of the insulating film on the top of the waveguide ridge;

removing the insulating film by dry etching, using the second resist pattern as a mask, thereby exposing the metal cap layer of the waveguide ridge;

removing the metal cap layer by wet etching, thereby exposing the second semiconductor layer; and forming an electrode layer on the surface of the second semiconductor layer of the waveguide ridge that is exposed.

2. The method for manufacturing a semiconductor optical device according to claim 1, including forming, as part of the second semiconductor layer of the second conductivity type, a contact layer adjoining the metal cap layer, in forming the semiconductor laminated structure.

3. The method for manufacturing a semiconductor optical device according to claim 1, wherein forming the second resist pattern comprises:
   forming the resist film on the insulating film, the resist film being thicker in the dent adjoining the waveguide ridge than on the top of the waveguide ridge; and
   evenly removing the resist film to expose the insulating film on the top of the waveguide ridge, while leaving the resist film in the dent adjoining the waveguide ridge.

4. The method for manufacturing a semiconductor optical device according to claim 1, wherein the second semiconductor layer is GaN.

5. A method for manufacturing a semiconductor optical device, comprising:
   forming, by photolithography, a first resist pattern of a resist film that is disposed on a top surface of a laminated semiconductor structure, including a first semiconductor layer of a first conductivity type, an active layer, a second semiconductor layer of a gallium nitride-based compound semiconductor material having a second conductivity type, and a metal cap layer, in sequence, on a substrate, the first resist pattern having a portion shaped in correspondence to a waveguide ridge;
   etching and removing the metal cap layer, using the first resist pattern as a mask, thereby exposing the second semiconductor layer;
   removing a part of the second semiconductor layer by dry etching, using the first resist pattern as a mask, thereby forming a dent, leaving a part of the second semiconductor layer on a bottom of the dent, and thereby forming the waveguide ridge; forming an insulating film on the surface of the semiconductor laminated structure containing the dent and the waveguide ridge having the metal cap layer on an uppermost surface, after removing the first resist pattern;
   forming a second resist pattern, the second resist pattern exposing an upper surface of the insulating film on top of the waveguide ridge, and burying the insulating film in the dent, adjoining the waveguide ridge, with a resist film having a surface farther from the substrate than the surface of the second semiconductor layer of the waveguide ridge and closer to the substrate than the upper surface of the insulating film on the top of the waveguide ridge;
   removing the insulating film by dry etching, using the second resist pattern as a mask, thereby exposing the surface of the metal cap layer of the waveguide ridge; removing the metal cap layer by wet etching, thereby exposing the second semiconductor layer; and
   forming an electrode layer on the surface of the second semiconductor layer of the waveguide ridge that is exposed.

6. The method for manufacturing a semiconductor optical device according to claim 1, wherein the metal cap layer is a metal selected from the group consisting of Au and Cr.

7. The method for manufacturing a semiconductor optical device according to claim 5, including forming, as part of the second semiconductor layer of the second conductivity type, a contact layer adjoining the metal cap layer, in forming the semiconductor laminated structure.

8. The method for manufacturing a semiconductor optical device according to claim 5, wherein forming the second resist pattern comprises:
   forming a resist film on the insulating film, the resist film being thicker in the dent adjoining the waveguide ridge than on the top of the waveguide ridge; and
   evenly removing the resist film to expose the insulating film on the top of the waveguide ridge, while leaving the resist film in the dent adjoining the waveguide ridge.

9. The method for manufacturing a semiconductor optical device according to claim 5, wherein the second semiconductor layer is GaN.

10. The method for manufacturing a semiconductor optical device according to claim 5, wherein the metal cap layer is a metal selected from the group consisting of Au and Cr.

* * * * *